(12) United States Patent
Okamoto et al.

(10) Patent No.: US 9,982,339 B2
(45) Date of Patent: May 29, 2018

(54) FILM-FORMING MASK, FILM-FORMING DEVICE, AND FILM-FORMING METHOD

(71) Applicant: Sharp Kabushiki Kaisha, Sakai, Osaka (JP)

(72) Inventors: Tetsuya Okamoto, Sakai (JP); Takeshi Hirase, Sakai (JP); Tohru Senoo, Sakai (JP); Tohru Sonoda, Sakai (JP); Daichi Nishikawa, Sakai (JP); Mamoru Ishida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days. days.

(21) Appl. No.: 15/547,204

(22) PCT Filed: Jan. 22, 2016

(86) PCT No.: PCT/JP2016/051881
§ 371 (c)(1),
(2) Date: Jul. 28, 2017

(87) PCT Pub. No.: WO2016/121652
PCT Pub. Date: Aug. 4, 2016

(65) Prior Publication Data
US 2018/0010244 A1 Jan. 11, 2018

(30) Foreign Application Priority Data
Jan. 29, 2015 (JP) .................. 2015-016022

(51) Int. Cl.
*H01L 21/00* (2006.01)
*C23C 16/04* (2006.01)
*H01L 51/52* (2006.01)
*H01L 51/56* (2006.01)

(52) U.S. Cl.
CPC ........ *C23C 16/042* (2013.01); *H01L 51/5237* (2013.01); *H01L 51/56* (2013.01)

(58) Field of Classification Search
CPC .............. H01L 31/02363; H01L 51/56; H01L 2924/181; H01L 31/02366; H01L 21/563
See application file for complete search history.

(56) References Cited

U.S. PATENT DOCUMENTS

| 3,849,136 A * | 11/1974 | Grebe ..................... G03F 7/095 430/314 |
| 7,968,895 B2 * | 6/2011 | Lin ....................... H01L 27/124 257/88 |
| 2007/0065597 A1 | 3/2007 | Kaido et al. |

FOREIGN PATENT DOCUMENTS

| JP | H02-250954 A | 10/1990 |
| JP | 2007-81404 A | 3/2007 |
| JP | 2014-133932 A | 7/2014 |
| JP | 2014-148745 A | 8/2014 |
| JP | 2014-214367 A | 11/2014 |

* cited by examiner

*Primary Examiner* — Roy Potter
(74) *Attorney, Agent, or Firm* — ScienBiziP, P.C.

(57) ABSTRACT

A mask comprises a mask substrate having a protruding section in an opening end surface of an opening, having an acute angle defined by θ1 and θ2 of no more than 43°, and having a height from a film-formation surface on the substrate to a tip section of the protruding section greater than the thickness of the film to be formed on the film-formation surface.

10 Claims, 15 Drawing Sheets

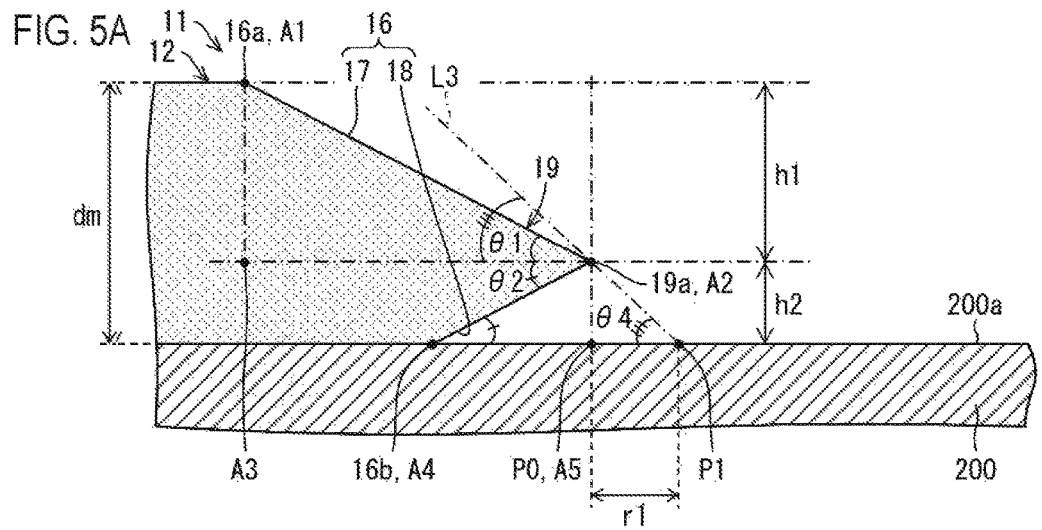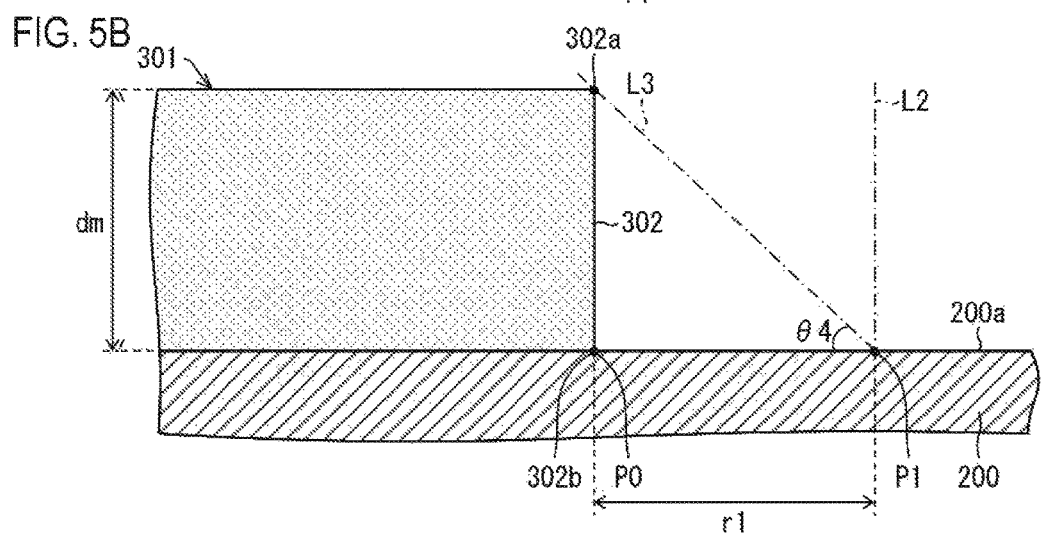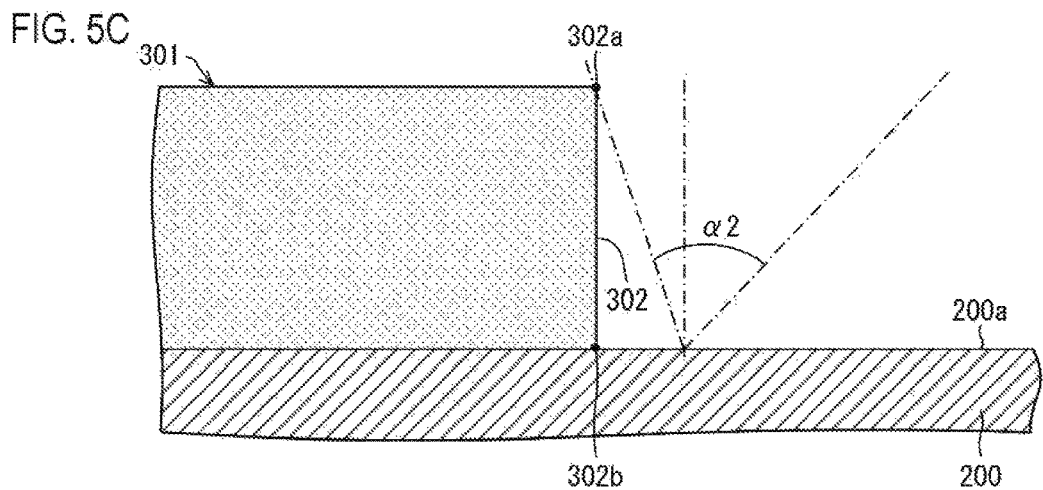

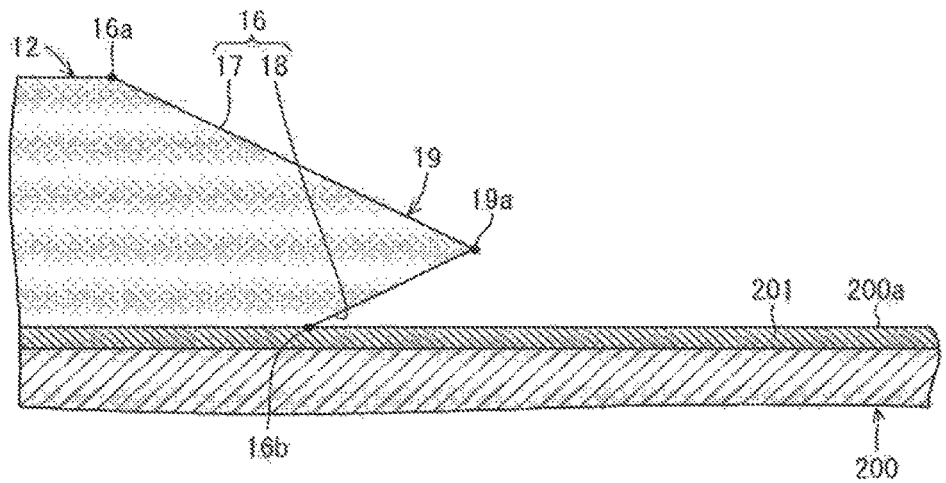
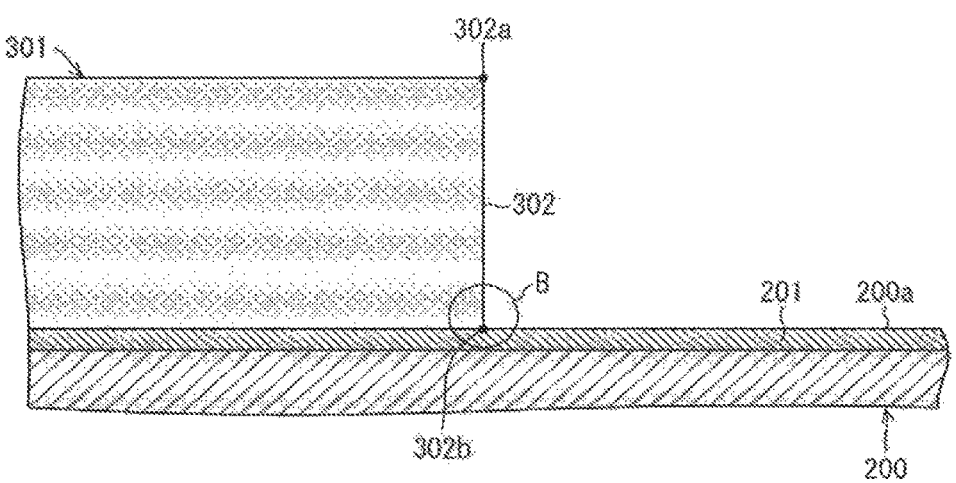
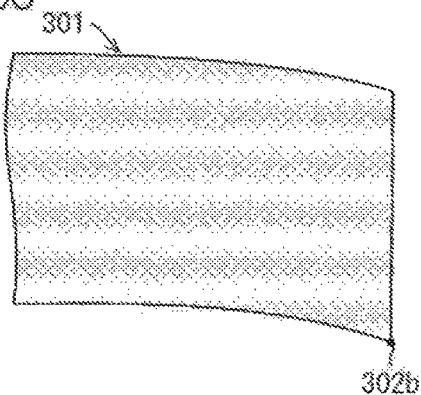
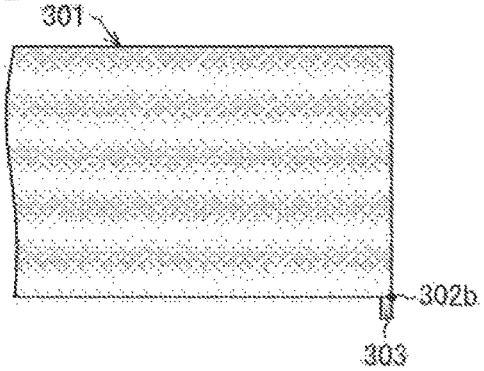

FILM-FORMING MASK, FILM-FORMING DEVICE, AND FILM-FORMING METHOD

TECHNICAL FIELD

The present disclosure relates to a film-forming mask, a film-forming device, and a film-forming method.

BACKGROUND ART

Organic electroluminescence (hereinafter referred to as "EL") display devices making use of the electroluminescence of organic materials have a faster response speed when compared with liquid crystal display devices and have attracted attention as display devices having a wide viewing angle.

An organic EL display device has a configuration including, for example, thin film transistors (TFTs) provided on a substrate, such as a glass substrate, and organic EL elements provided on the substrate connected to the TFTs.

Organic EL elements are light emitting elements capable of emitting light at high luminance using low voltage direct current driving, and have a configuration in which a first electrode, an organic EL layer, and a second electrode are layered in this order.

An organic EL layer includes an organic compound layer including a light emitting layer, but the characteristics thereof degrade by reacting with minuscule amounts of water or oxygen, damaging the life of the display device. For this reason, in manufacturing an organic EL display device, the formation of a sealing member that prevents the intrusion of water into the organic EL elements is indispensable.

In the film formation of a sealing member, a chemical vapor deposition (CVD) device such as a plasma CVD device can be used.

In a CVD device, a film-forming gas is introduced into a chamber that has been evacuated to vacuum, a plasma is generated between an upper electrode and a lower electrode disposed in the chamber to decompose and react film-forming gas. Through this, a film that comprises reaction products is formed as a sealing film that covers the organic EL elements on a substrate disposed on the lower electrode.

The sealing film is pattern formed in any shape by using a film-forming mask (hereinafter referred to simply as "mask") for each organic EL display device such that the connection terminals between the organic EL display device and the outside and the like are not covered.

CITATION LIST

Patent Literature

PTL 1: Japanese Unexamined Patent Application Publication No. 2007-81404 A (published Mar. 29, 2007).

SUMMARY

Technical Problem

However, when forming a film by disposing a mask on a substrate, in the vicinity of the mask edge (mask opening edge), the mask becomes an obstacle, and the film, which originally was supposed to be formed on the substrate, is formed on the mask. For this reason, in the vicinity of the mask edge, the film thickness of the film formed on the substrate becomes thin.

Further, if the film thickness of the sealing film formed on the substrate decreases, then sufficient sealing performance cannot be obtained, leading to a worsening of the reliability of the organic EL elements and further, to a worsening of the reliability of the organic EL display device.

In addition, when forming a film by disposing a mask on a substrate, if the film formed at the mask edge and the film formed on the substrate are connected, then when the mask is removed from the substrate following film formation, there has been the problem of the film near the tip section of the mask peeling off. Further, if film formation is continued to be carried out, then the peeled film is incorporated into the film being formed. In this way, if the peeled film is incorporated into the sealing film in a subsequent film formation, then the coverage of the sealing film worsens, a passage for water or oxygen is formed, and the sealing performance decreases. As a result of this, the reliability of the organic EL elements decreases.

FIG. 15 is a cross-sectional view illustrating a schematic configuration of a main part of the CVD device described in PTL 1.

As illustrated in FIG. 15, the CVD device described in PTL 1 comprises a shower plate that is not illustrated and that functions as an upper electrode, a top plate 501 for placing a wafer 502 (substrate), the top plate functioning as a lower electrode, a top mask portion 511 covering a top surface peripheral portion 502a of the wafer 502, and a side mask portion 512 disposed under the top mask portion 511 configured to cover a side surface 502b of the wafer 502 when the top plate 501 is at an upper position.

An opening end surface of the top mask portion 511 is an inclined surface and an opening end surface of the side mask portion 512 is a vertical surface. The top mask portion 511 and the side mask portion 512 are integrated to form a bevel mask 510.

In PTL 1, the top mask portion 511 is disposed at a clearance of TW+β between a bottom surface 511a of the top mask portion 511 and a wafer-supporting surface 501a of the top plate 501. As illustrated in FIG. 15, TW is the thickness of the wafer 502 and f is a gap between the bottom surface 511a of the top mask portion 511 and the top surface peripheral portion 502a of the wafer 502. In PTL 1, β is at least 0, and preferably in the range of 0.05 to 0.75 mm.

When using the bevel mask 510 having such a shape, if β=0, at a contact position between a mask edge of the top mask portion 511 and the wafer 502, a sealing film formed on the top mask portion 511 and a sealing film formed on the wafer 502 connect with one another, so when the bevel mask 510 is removed from the wafer 502, the problem of the film near the tip section of the top mask portion 511 peeling occurred.

On the other hand, when β is greater than 0—that is, cases where there is a gap provided between the top mask portion 511 and the wafer 502—though it depends on the size of the gap, the films formed between the top mask portion 511 and the wafer 502 do not connect, so the problem of the film peeling does not occur.

However, in this case, unless the top mask portion 511 is raised at a fixed amount with respect to the wafer 502, the distance from the mask edge to a position (hereinafter referred to as "90% film thickness position") at which a film thickness of 90% of a set film thickness is obtained, this being the film thickness lower limit value needed to ensure sealing performance, varies depending on the position in the top mask portion 511.

However, masks are normally affected by bending and thermal strain. The bevel mask 510 is the same with respect to this point, so raising the top mask portion 511 at a fixed amount with respect to the top surface peripheral portion 502a of the wafer 502 is difficult.

In addition, by raising the top mask portion 511 at a fixed amount with respect to the top surface peripheral portion 502a of the wafer 502, the sealing film to be formed is formed wider than an opening 520 of the top mask portion 511 by the amount the top mask portion 511 is raised. If the amount of the gap between the top mask portion 511 and the wafer 502 fluctuates, then the sealing film spreads beyond the opening 520 and the width at which it is formed also fluctuates. For this reason, the amount of the gap affects not only the design dimensions (margin), but also, because the sealing film may be formed on the connection terminals to the outside depending on how the sealing film spreads, poor connections may result as well as because the edge of the sealing film may not come to a desired position, the desired reliability may not be obtained.

In addition, the side mask portion 512 comprises an inner diameter of Dw+α with respect to the wafer 502 of the diameter Dw. Here, α is at least zero, and suitably, α is within the range of 0.05 to 2 mm. Put another way, in PTL 1, as illustrated in FIG. 15, gaps are respectively provided between the top mask portion 511 and the side mask portion 512 and the wafer 502.

In this way, with gaps between the top mask portion 511 and the side mask portion 512 and the wafer 502, as the CVD gas flows to enter into these gaps, the flow of the CVD gas changes. For this reason, a sealing film is not formed only in a desired region, and a sealing film pattern of the shape defined by the bevel mask 510 cannot be obtained.

For this reason, in a state where the top mask portion 511 is raised with respect to the top surface peripheral portion 502a of the wafer 502, as described in PTL 1, disposing the bevel mask 510 on the wafer-supporting surface 501a of the top plate 501 is problematic in the securing of sealing properties in the vicinity of the mask edge and in the securing of reliability of the sealing film.

The present disclosure was conceived of in view of these problems, and the purpose is to provide a film-forming mask, film-forming device, and film-forming method capable of preventing film thickness decreases in the mask edge vicinity of the film formed and of preventing film peeling that occurs when removing the film-forming mask from the substrate.

Solution to Problem

In order to solve the problems described above, the film-forming mask according to one embodiment of the present invention is a film-forming mask used overlapping a film-formation substrate and comprising an opening that exposes a film-formation surface of the film-formation substrate, comprising, in an opening end surface in the opening, a protruding section that protrudes more inward of the opening more than a first edge portion which is a contact side edge portion with the film-formation substrate in the opening end surface and a second edge portion which is an edge portion of the other side, wherein, when viewed from a side of the second edge portion, an acute angle defined between a plane passing through a corner portion positioned most inward of the opening of the corner portions of the opening end surface including the second edge portion and a tip section of the protruding section and a corner portion positioned second most inward of the opening and a plane parallel to the film-formation surface is defined as θ1, wherein, when viewed from the first edge portion, an acute angle defined between a plane passing through a corner portion positioned most inward of the opening of the corner portions of the opening end surface including the first edge portion and a tip section of the protruding section and a corner portion positioned second inward of the opening and a plane parallel to the film-formation surface is defined as θ2, wherein θ1 and θ2 are 43° or less, and wherein, the height from the film-formation surface to the tip section of the protruding section is equal to or greater than the thickness of the film to be formed on the film-formation surface.

In addition, in order to solve the technical problems noted above, the film-forming device according to one embodiment of the present invention comprises the film-forming mask according to one embodiment of the present invention.

In addition, in order to solve the technical problems noted above, the film-forming method according to one embodiment of the present invention comprises superimposing and arranging the film-forming mask according to one embodiment of the present invention and the film-formation substrate such that the first edge portion of the film-forming mask is in contact with the film-formation substrate and depositing a film-forming material on the film-formation surface of the film-formation substrate via the opening in the film-forming mask.

Advantageous Effects of Invention

According to one embodiment of the present invention, a film-forming mask, film-forming device, and film-forming method capable of preventing film thickness decreases in the mask edge vicinity of the film to be formed and of preventing film peeling that occurs when removing the film-forming mask from the substrate are provided.

BRIEF DESCRIPTION OF DRAWINGS

FIGS. 5A to 5C are drawings for explaining the effects of a mask according to embodiment 1 of the present invention.

FIGS. 6A to 6D are drawings for explaining the effects of the mask according to embodiment 1 of the present invention.

DESCRIPTION OF EMBODIMENTS

A detailed description follows regarding embodiments to carry out the present invention.

First Embodiment

A description follows regarding an embodiment of the present invention, on the basis of FIGS. 1A and 1B to FIGS. 9A to 9C.

A mask according to the present embodiment is a film-forming mask used to form a film having a predetermined pattern on a film-formation substrate.

As a film-formation substrate, for example, a semiconductor substrate such as an insulation substrate or an organic EL substrate wherein an organic EL element or the like is formed over an insulation substrate is used.

The mask described above, conventionally, could be used in film formation in general of a film being formed by using a mask. For this reason, as the film of the prescribed pattern, while there are no particular limitations, for example, a sealing film that covers organic EL elements in an organic EL display device can be provided as an example.

In particular, in an organic EL display device, preventing decreases in film thickness and film peeling in an edge portion of the sealing film, insofar as this secures the reliability of the organic EL display device, is extremely important.

Therefore, in the present embodiment, the mask according to the present embodiment and a film-forming device using this mask are explained using, as an example, the use of these as a mask for forming a sealing film in an organic EL display device and a manufacturing device of an organic EL display device comprising this mask.

Schematic Configuration of Organic EL Display Device

Figure 8A:
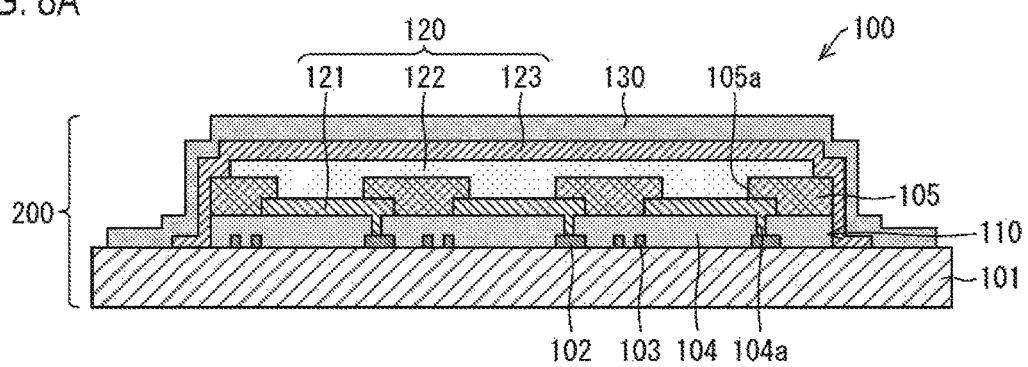
FIG. 8A is a cross-sectional view illustrating an example of a schematic configuration of an organic EL display device manufactured in embodiment 1 of the present invention.
Figure 8B:
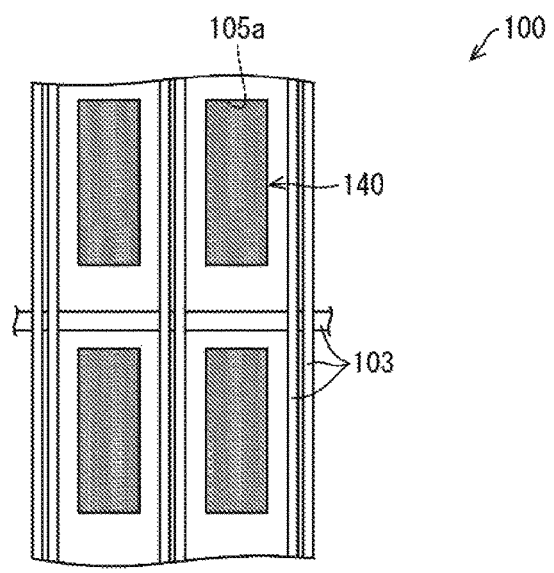
FIG. 8B is a plan view illustrating a schematic configuration of sub-pixels of the organic EL display device illustrated in FIG. 8A.

First, making reference to FIGS. 8A and 8B, the organic EL display device is explained.

FIG. 8A is a cross-sectional view illustrating an example of a schematic configuration of the organic EL display device 100 manufactured in the present embodiment. FIG. 5B is a plan view illustrating a schematic configuration of sub-pixels 140 of the organic EL display device illustrated in FIG. 8A.

As illustrated in FIG. 8A, the organic EL display device 100 comprises a configuration wherein organic EL elements 120 and a sealing film 130, in this order, are provided on a TFT (thin film transistor) substrate 110.

The TFT substrate 110 comprises an insulation substrate 101 comprising a glass substrate or plastic substrate as a support substrate. TFT 102, signal lines 103, an interlayer insulation film 104 and the like are provided on the insulation substrate 101.

Signal lines 103 are formed from a plurality of gate lines, a plurality of source lines, a plurality of power lines, and the like. In each region surrounded by the signal lines 103 in a lattice form, sub-pixels 140 of respective colors are arranged. For example, one pixel is formed from a set of sub-pixels of red (R), green (G), and blue B.

Each sub-pixel 140 is respectively provided with TFT 102. The TFTs 102 are respectively connected to signal lines 103, select sub-pixels to be signal inputted with the gate lines, and with the source lines, determine the amount of the charge to be inputted into the selected sub-pixels, and from the power lines, feed a current to the organic EL elements 120.

TFT 102 and the signal lines 103 are covered by the interlayer insulation film 104. As a material of the interlayer insulation film 104, an insulation material such as, for example, an acrylic resin or a polyimide resin can be used. The thickness of the interlayer insulation film 104 is not particularly limited, provided it can eliminate the level difference of the upper surface of the TFT 102 and the signal lines 103.

The organic EL elements 120 are formed from a first electrode 121 (positive electrode), an organic EL layer 122, a second electrode 123 (negative electrode) and the like.

The first electrode 121 is formed on the interlayer insulation film 104. The first electrode 121 infuses (supplies) the organic EL layer 122 with positive holes and the second electrode 123 infuses the organic EL layer 122 with electrons. The first electrode 121 is electrically connected to the TFT 102 via contact holes 104a formed in the interlayer insulation film 104.

An edge portion of the first electrode 121 is covered by an edge cover 105. The edge cover 105 is an insulation film, and is formed, for example, from a photosensitive resin. The edge cover 105 prevents electrode concentration and the organic EL layer 122 from becoming thin and short-circuiting with the second electrode 123 at the edge portion of the first electrode 121. Further, the edge cover 105 also functions as a pixel separation film preventing a current from leaking to adjacent sub-pixels 140.

The edge cover 105 is provided with an opening 105a for each sub-pixel 140. Through the openings 105a, an exposed portion of the first electrode 121 acts as a light emission region for each of the sub-pixels 140.

The organic EL layer 122 is provided between the first electrode 121 and the second electrode 123. The organic EL layer 122 comprises a configuration wherein, from a side of the first electrode 121, for example, a positive hole infusion layer, a positive hole transport layer, a luminous layer, an electron transport layer, an electron infusion layer, and the like in this order, are layered. Further, one layer may include a plurality of functions. For example, in place of the positive hole infusion layer and the positive hole transport layer, a positive hole infusion layer/positive hole transport layer, which includes the functions of both previously-mentioned layers, can be provided. In addition, in place of the electron infusion layer and the electron transport layer, an electron infusion layer/electron transport layer, this including the functions of both previously-mentioned layers, can be provided. Moreover, between each layer, a carrier blocking layer can appropriately be provided.

In addition, in FIG. 8A, while the first electrode 121 is designated as a positive electrode (pattern electrode, pixel electrode) and the second electrode 123 is designated as a negative electrode (common electrode), the first electrode 121 can be designated as a negative electrode and the second electrode 123 can be designated as a positive electrode. However, in such a case, the ordering of each layer forming the organic EL layer 122 is reversed.

Further, when the organic EL display device 100 is a bottom emission type in which light is emitted from the back surface side of the insulation substrate 101, it is preferable that the second electrode 123 is formed from a reflective electrode material and that the first electrode 121 is formed from a transparent or translucent electrode material.

On the other hand, if the organic EL display device 100 is a top emission type in which light is emitted from a side of the sealing film 130, it is preferable that the first electrode 121 is formed from a reflective electrode material and that the second electrode 123 is formed from a transparent or translucent electrode material.

The sealing film 130 is formed on the second electrode 123 to cover the second electrode 123, the organic EL layer 122, the edge cover 105, the interlayer insulation film 104 and the like. In addition, for adjustments of optical characteristics, an organic layer (not illustrated) can be provided between the second electrode 123 and the sealing film 130.

The sealing film 130 prevents degradation of the organic EL elements 120 caused by the infiltration of water and oxygen from the outside. The sealing film 130 is formed from an inorganic film or from a layered film of an inorganic film and an organic film. As one example, silicon nitride and silicon oxide can be provided. The thickness of the sealing film 130, though it depends on the materials and the like, is, for example, from 500 to 5000 nm.

Manufacturing Method of the Organic EL Display Device 100

Next, the manufacturing method of the organic EL display device 100 is explained below.

First, on the insulation substrate 101, TFT 102 signal lines 103 and the like are formed with a conventionally-known method. Next, a photosensitive resin is applied to the insulation substrate 101 to cover the TFT 102 and the signal lines 103, and through photolithography techniques, patterning is performed. Through this, the interlayer insulation film 104 is formed on the insulation substrate 101.

Next, contact holes 104a are formed on the interlayer insulation film 104 to electrically connect the first electrode 121 to the TFT 102.

Continuing, the first electrode 121 is formed on the interlayer insulation film 104. The first electrode 121 can be formed by etching the conductive film and peeling off the photoresist after forming a conductive film (electrode film) on the interlayer insulation film 104, coating a photoresist on the conductive film, and performing patterning by photolithography techniques.

On the layers of the conductive film, sputtering methods, vacuum deposition methods, CVD methods, plasma CVD methods, printing methods and the like can be used.

Below, a mask and CVD device comprising this mask according to the present embodiment are explained using cases where these are used in the film formation of the sealing film 130 as an example. However, it goes without saying that the mask and the CVD device according to the present embodiment can be used in the film formation of the conductive film.

Next, an edge cover 105 of a predetermined pattern is formed. As described above, the TFT substrate 110 and the first electrode 121 are manufactured.

The TFT substrate 110 on which the first electrode 121 is formed is subjected to a reduced pressure bake treatment for dehydration and further subjected to an oxygen plasma treatment to clean the surface of the first electrode 121.

Subsequently, the organic EL layer 122 including a luminous layer is formed on the TFT substrate 110. In the film formation of the organic EL layer 122, ink jet methods, printing methods, vacuum deposition methods, CVD methods, plasma CVD methods and the like can be used. That is, the mask and CVD device according to the present embodiment can be used in the film formation of the organic EL layer 122.

For example, when an organic layer such as a positive hole infusion layer and a positive hole transport layer or an electron infusion layer and electron transport layer or the like is deposited over the entire surface of the display region of the TFT substrate 110, an open mask in which the entire surface of the display region is opened may be used as the mask according to the present embodiment.

Further, in order to perform full color display, the luminous layer may be separately coated and deposited for each emission color, and a method of selecting a light emission color in each sub-pixel 140 by combining a white light emitting EL element using a light emitting layer having a white (W) emission color and a color filter (CF) layer, and a method of realizing a full color image display by using a light emitting layer having a light emitting color of W color and introducing a microcavity structure in each sub-pixel 140 may be adopted.

Further, in a configuration of changing the emission color of each sub-pixel 140 by a method such as a CF layer or a microcavity structure or the like, there is no need to separately coat the luminous layer on each sub-pixel 140. The mask and the CVD device according to the present embodiment can also be used in the film formation of such a luminous layer.

Next, the second electrode 123 is formed on the entire surface of the display region of the TFT substrate 110 to cover the organic EL layer 122. The second electrode 123, for example, can be formed by a method similar to that of the positive hole infusion layer, the positive hole transport layer, and the like. Accordingly, the mask and the CVD device according to the present embodiment can also be used in the film formation of the second electrode 123.

With the method described above, an organic EL element 120 comprising the first electrode 121, the organic EL layer 122, and the second electrode 123 is formed on the TFT substrate 110.

Subsequently, the sealing film 130 is formed on the second electrode 123 to cover the second electrode 123 by using the mask. In the formation of the sealing film 130, for example, a plasma CVD method can be used.

Figure 2A:
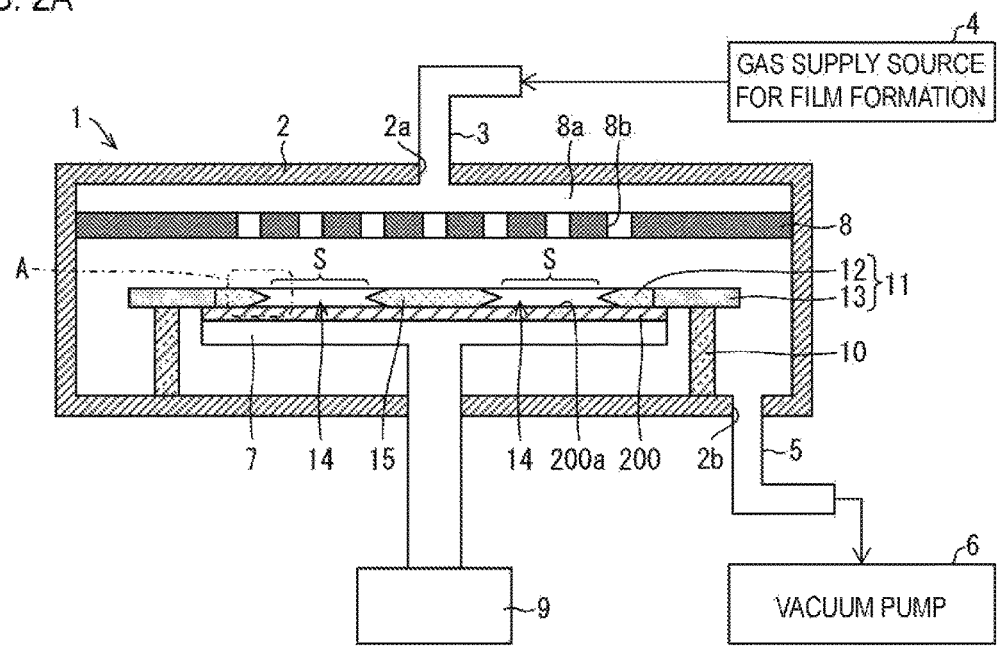
FIG. 2A is a cross-sectional view illustrating an example of a schematic configuration of a CVD device according to embodiment 1 of the present invention.
Figure 2B:
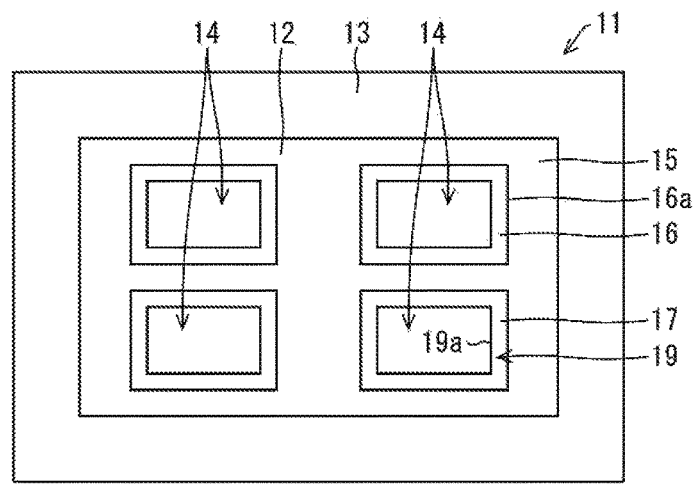
FIG. 2B is a plan view illustrating an example of a schematic configuration of a mask used in the CVD device illustrated in FIG. 2A.

Schematic Configuration of Manufacturing Device of the Organic EL Display Device Next, one example of the film-forming device used as the manufacturing device of the organic EL display device 100 according to the present embodiment is explained making reference to FIGS. 2A and 2B. However, the device indicated below is one example of the film-forming device according to the present embodiment, and the arrangement and mechanisms of the components forming the film-forming device can appropriately be altered.

FIG. 2A is a cross-sectional view illustrating one example of the schematic configuration of the CVD device 1 used as a manufacturing device of the organic EL display device 100 according to the present embodiment, and FIG. 2B is a plan view illustrating one example of the schematic configuration of the mask 11 used in the CVD device 1 illustrated in FIG. 2A.

In addition, in the following explanation, for the sake of simplifying the explanation, a contact side surface with the substrate 200 in the mask 11 is designated as a lower side, and the gas supply side for film formation, which is the opposite side—that is, a side of the gas supply port 2a (deposition source side) in the chamber 2—is designated as an upper side, and the following explanation follows from this assumption. However, the arrangement of the mask 11 and the substrate 200 can be switched depending on the spraying direction of the film-forming gas. Accordingly, depending on the spraying direction of the film-forming gas, the wording "upper (side)" and "lower (side)" in the following explanation can be switched. That is, by altering the arrangement of the components in the chamber 2, when the film-forming gas is sprayed from the lower side illustrated in FIG. 2A towards the upper side, then the "opening portion upper edge 16a" and the "opening portion lower edge 16b" of the mask 11 illustrated in FIGS. 1A and 1B, for example, should be read, respectively, as "opening portion lower edge 16a" and "opening portion upper edge 16b." However, in any case, the "opening portion upper edge 16a" or the "opening portion lower edge 16a" represents the contact side edge portion (opening edge, first edge portion) with the substrate 200 and the "opening portion lower edge 16b" or the "opening portion upper edge 16b" represents an edge portion (opening edge, second edge portion) of the deposition source side (the side of the gas supply port 2a).

As illustrated in FIG. 2A, the CVD device 1 (film-forming device) according to the present embodiment comprises the chamber 2, the gas supply pipe 3, the gas supply source for film formation 4, the exhaust pipe 5, the vacuum pump 6, the susceptor 7, the shower head 8, the RF plasma power source 9, the mask elevator mechanism 10, the mask 11, the susceptor elevator mechanism and the like, which is not illustrated in the drawing.

The chamber 2 is a film formation chamber, and an upper portion of the chamber 2 is provided with the gas supply port 2a that supplies the film-forming gas. The gas supply port 2a is connected to the gas supply source for film formation 4 provided outside of the chamber 2 via the gas supply pipe 3.

In addition, a lower portion of the chamber 2 is provided with an exhaust port 2b. The exhaust port 2b is connected to the vacuum pump 6 provided outside of the chamber 2 via the exhaust pipe 5. Thus, the chamber 2 is configured to maintain the interior thereof in a vacuum state. Further, after film formation, unneeded gas present in the chamber 2 is expelled to the outside of the chamber 2 via the exhaust pipe 5 and the vacuum pump 6 from the exhaust port 2b.

Moreover, the chamber 2 is provided with a temperature control mechanism that is not illustrated in the drawings, and the temperature of the chamber is controlled to be a desired temperature.

The inside of the chamber 2 is provided with the susceptor 7 (top plate), the shower head 8, the mask elevator mechanism 10, the mask 11 and the like.

The susceptor 7, within an interior thereof, is provided with a conductive body that is not illustrated in the drawings and that functions as a bottom electrode. The radio frequency (RF) plasma power source 9, provided on the outside of the chamber 2, is connected to the conductive body.

Further, the susceptor 7 comprises a temperature control mechanism that is not illustrated in the drawings at a rear surface or interior thereof, and during film formation, the substrate 200, which is the film-formation substrate, is mounted and heated to a constant temperature and maintained.

A mother board, as illustrated in FIG. 2A, comprising an organic EL substrate in which a plurality of organic EL display devices 100 is formed before the formation of the sealing film 130, is used as the substrate 200 in the present embodiment. That is, in the present embodiment, a substrate having a plurality of organic EL elements 120 formed on the same insulation substrate 101 via TFT 102, signal lines 103, the interlayer insulation film 104 and the like is used.

The shower head 8 is an upper electrode, and is provided facing the susceptor 7 via the mask 11. The shower head 8, the mask 11, and the susceptor 7 are provided in parallel with one another.

The shower head 8 comprises a gas diffusion chamber 8a connected to the gas supply port 2a on an interior thereof and comprises a plurality of gas spray apertures 8b on a surface opposite the mask 11. The film-forming gas introduced into the gas diffusion chamber 8a from the gas supply port 2a is sprayed in a shower form from above the mask 11 through the gas spray apertures 8b.

Between the susceptor 7 and the shower head 8, the mask 11 is disposed. The configuration of the mask 11 is explained later.

In addition, the mask 11 is provided with the mask elevator mechanism 10 that moves the mask 11 up and down. Further, the susceptor 7 is also provided with the susceptor elevator mechanism that is not illustrated in the drawings and that moves the susceptor 7 up and down. Through this, it is possible to arbitrarily adjust the distance between the shower head 8 and the mask 11 and the distance between the mask 11 and the susceptor 7.

In the CVD device 1, the film-forming gas is introduced into the chamber 2 that has been evacuated in vacuum, a plasma is generated between the susceptor 7 and the shower head 8 disposed in the chamber 2, and the film-forming gas is decomposed and reacted. Through this, a film comprising reaction products is formed as the sealing film 130 that covers the organic EL elements 120 on the substrate 200 disposed on the susceptor 7.

The sealing film 130 is pattern formed by using the mask 11 for each organic EL display device 100 in order not to cover a connection terminal between the organic EL display devices 100 and the outside.

Schematic Configuration of the Mask 11

The mask 11 is embedded in the CVD device 1 and is a film-forming mask used to form the sealing film 130 of a predetermined pattern on the substrate 200 as a deposited film.

The mask 11 comprises a mask substrate 12 and a mask frame 13, as illustrated in FIGS. 2A and 2B.

The mask substrate 12 is a plate-shaped mask main body (mask portion) and the mask frame 13 has a frame shape wherein the center is opened and is a support member (frame portion) that supports the mask substrate 12 at an edge portion (peripheral edge portion).

The mask substrate 12, for example, is tension welded to the mask frame 13. The mask frame 13 is used to prevent the mask substrate 12 from deforming and to secure the mask 11 in the CVD device 1. However, the mask frame 13 is not indispensable, and the mask substrate 12 itself can be used as the mask 11.

The mask substrate 12 includes a size and shape substantially the same as those of the substrate 200. The mask 11 is used by being superimposed on the substrate 200 so that one principal surface of the mask substrate 12 contacts (closely contacts) the film-formation surface 200a of the substrate 200.

The principal surface of the mask 11—that is, the principal surface of the mask substrate 12 is provided with an opening 14 that exposes each film-forming region S at a position corresponding to each film-forming region S of the substrate 200 in plan view.

The opening 14 is a through opening, and during film formation, this functions as a passage port that passes the film-forming gas that forms the sealing film 130. On the other hand, the regions aside from the opening 14 in the mask substrate 12 are non-opening portions 15 and function as shielding portions that shield or block the film-forming gas.

In addition, in the present embodiment, one film-forming region S corresponds to one organic EL display device 100. However, the configuration of the film-forming regions S in the substrate 200 is different depending on the device to be manufactured and the type of the film to be formed. Depending on the type of film to be formed, for example, one film-forming region S may be one sub-pixel.

In addition, in the present embodiment, a case where a plurality of rectangular openings 14 is arranged two-dimensionally (in a matrix) on the mask substrate 12 is provided as an example, but the shape and arrangement of the opening 14 are not limited to these. The shape and the arrangement of the opening 14 can be appropriately set to obtain a desired film formation pattern in accordance with the type of film to be formed and the film-forming method and the like. For example, the opening 14 can be arranged only in the one-dimensional direction and only one can be provided. Further, the shape of the opening 14 is not limited to a rectangular shape and can be appropriately set in accordance with the type of film to be formed.

Moreover, the size (plan view size) of the mask substrate 12 is not particularly limited, provided it can be appropriately set in accordance with the size of the substrate 200 (film-formation substrate). In addition, the size (plan view size) of the opening 14 is not particularly limited, provided it can also be appropriately set, allowing a desired film formation pattern to be obtained in accordance with the type of film to be formed. These conditions can be designed to be the same as those of conventional film-forming masks.

In addition, the thickness of the mask substrate 12 can also be appropriately set in accordance with the size (plan view size) and the weight of the mask substrate 12.

In addition, the material of the mask 11 is not particularly limited and materials the same as those of conventional film-forming masks can be used. The material of the mask 11 can be metal and it can be ceramic and it can be resin. Further, the mask 11 can be a composite mask making use of two or more types of these materials.

In addition, it can be formed from the same material of the mask substrate 12 and the mask frame 13 and it can be formed from a different material.

Film-Forming Method

Next, one example of the film-forming method according to the present embodiment making use of the CVD device 1 illustrated in FIGS. 2A and 2B is explained.

First, the mask 11 and the substrate 200 are superimposed and arranged (mask alignment step) on the substrate 200 such that one principal surface of the mask substrate 12 contacts (closely contacts) the film-formation surface 200a of the substrate 200 by the mask elevator mechanism 10 and the susceptor elevator mechanism, the latter of which is not illustrated in the drawings.

Next, a film-forming gas (a source gas forming a film-forming material and a gas generating a plasma) is introduced into the chamber 2 from the gas supply port 2a. The film-forming gas is uniformly supplied to the film-formation surface 200a of the substrate 200 via the shower head 8.

Subsequently, through the RF plasma power source 9 connected to the susceptor 7, which is a bottom electrode, a plasma is generated between the shower head 8 and the susceptor 7. The source gas is decomposed and reacted through the plasma and, by depositing the film-forming material (film-forming particles) on the substrate 200, a desired film is formed (film-forming material deposition step).

In addition, the mask 11 is controlled by the mask elevator mechanism 10 and the susceptor elevator mechanism, the latter of which is not illustrated in the drawings, such that the mask 11 comes into close contact with the substrate 200 during film formation.

Further, the temperatures of the chamber 2 and the susceptor 7 are controlled to arrive at a desired process during film formation, when the substrate 200 is an organic EL substrate (that is, cases of manufacturing an organic EL display device), the temperatures of the chamber 2 and the susceptor 7 are controlled at low temperatures (less than 100° C.) so that the organic EL layer does not degrade due to heat.

In a low temperature (100° C. or less) plasma CVD, as the promotion of film formation by the thermal energy on the substrate surface is weak, in general, the reaction in plasma becomes more dominant than the reaction on the substrate surface.

Accordingly, the amount of particles flying from the plasma to the film-formation surface 200a of the substrate 200 determines the film thickness of the formed film. Therefore, low temperature plasma CVD, generally, is strongly influenced by shadows caused by the mask.

Configuration of the Mask Substrate 12

Accordingly, the configuration of the mask substrate 12 in the mask 11 according to the present embodiment is explained in more detail below.

Figure 1A:
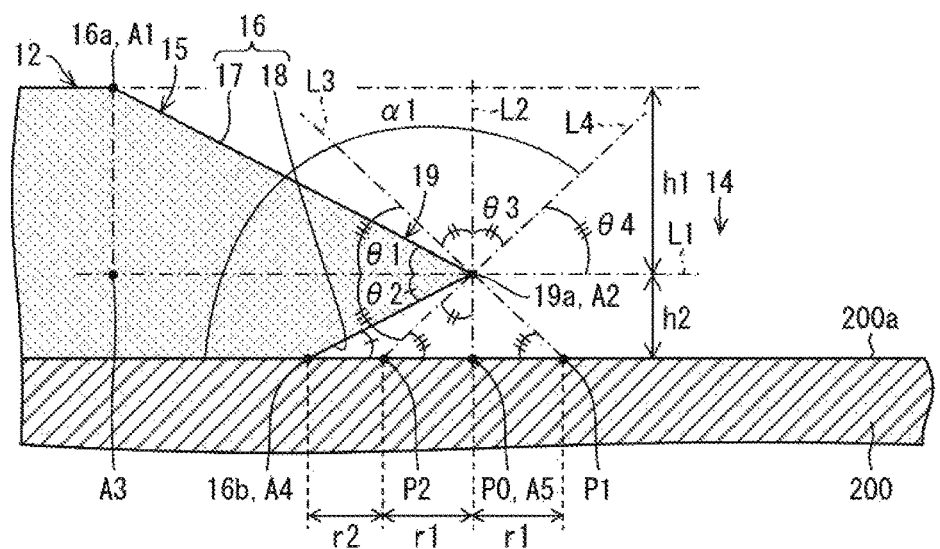
FIGS. 1A and 1B are cross-sectional views illustrating the configuration of the opening end surface of a mask substrate according to embodiment 1 of the present invention.
Figure 1B:
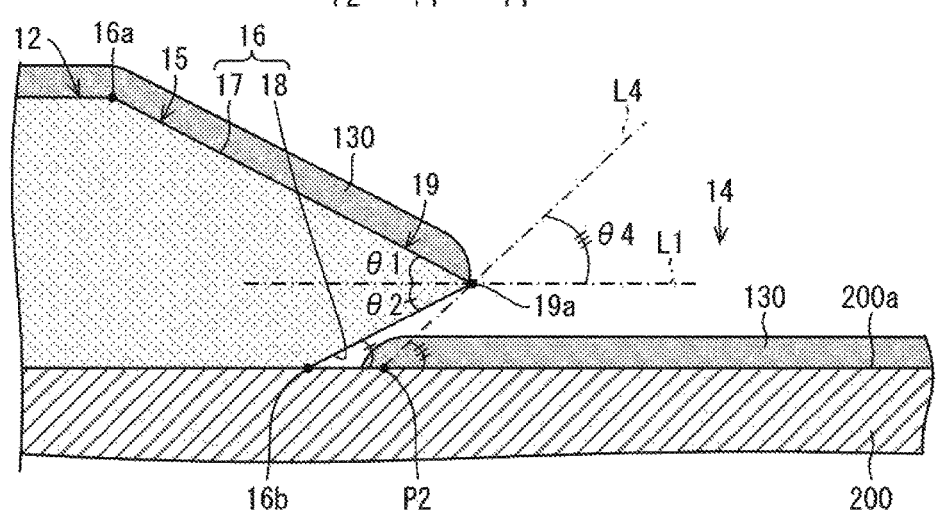

FIGS. 1A and 1B are cross-sectional views illustrating the configuration of the opening end surface 16 of the mask substrate 12 according to the present embodiment. Further, FIGS. 1A and 1B illustrate the configuration in the region A indicated by the alternate long and short dashed line in FIG. 2A. Further, FIG. 1A illustrates the configuration of the opening end surface 16 of the mask substrate 12 before formation of the sealing film 130 and FIG. 1B illustrates the configuration of the opening end surface 16 of the mask substrate 12 after formation of the sealing film 130.

As illustrated in FIGS. 1A and 1B and FIGS. 2A and 2B, in the mask substrate 12 according to the present embodiment, each opening end surface 16 forming each inner wall of the opening 14, comprises a protruding shape formed in a tapered shape toward the inside of the opening 14 (that is, the in-mask plane direction)—in other words, toward the opening end surface 16 opposed to the opening end surface 16.

For this reason, the opening 14, between an upper edge 16a (hereinafter written as "opening portion upper edge")

and a lower edge 16b (hereinafter written as "opening portion lower edge") of the opening end surface 16 in the opening 14, comprises a protruding section 19 that comprises the opening end surfaces 16 and that protrudes toward an inner side of the opening 14 more than the opening portion upper edge 16a and the opening portion lower edge 16b.

In addition, here, the opening portion lower edge 16b indicates a boundary portion with the substrate 200 at the opening end surface 16 which is a contact side edge portion (opening edge, first edge portion) with the substrate 200 and the opening portion upper edge 16a indicates an edge portion (opening edge, second edge portion) on the deposition source side (the side of the gas supply port 2a) which is the opposite side.

That is, in the present embodiment, when superimposing and arranging the mask 11 and the substrate 200 such that one principal surface of the mask substrate 12 comes into contact (close contact) with the film-formation surface 200a of the substrate 200, they are superimposed and arranged such that the opening portion lower edge 16b comes into contact (close contact) with the film-formation surface 200a of the substrate 200.

In the present embodiment, each opening end surface 16 comprises a tapered protruding section 19 formed from the opening portion upper edge 16a to the opening portion lower edge 16b, so the opening end surfaces 16 include a shape in which the lower portion of an inclined surface is cut out, the inclined surface inclined such that the opening area viewed in plan view becomes relatively small.

Figure 7A:
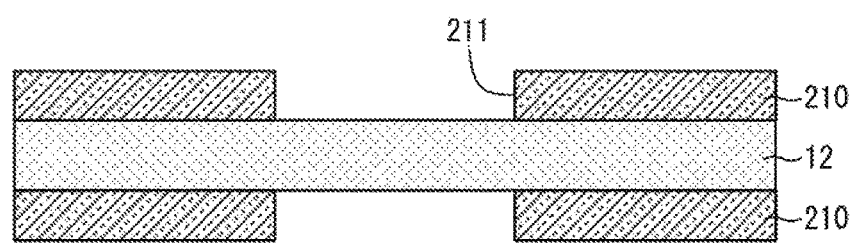
FIGS. 7A to 7C are cross-sectional views illustrating an example of a mask manufacturing method according to embodiment 1 of the present invention in the order of steps.
Figure 7B:
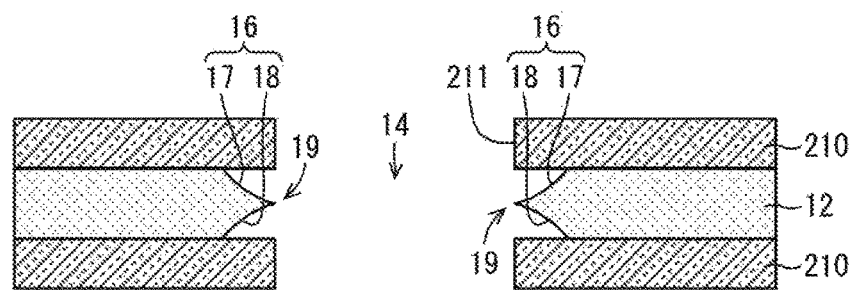
Figure 7C:
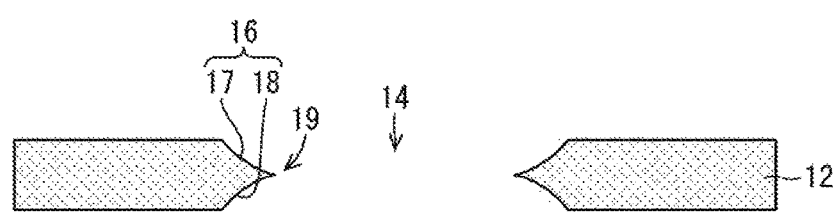

Therefore, opening end surfaces 16 that face one another are such that the opening portion upper edge 16a and the opening portion lower edge 16b are designated as a hem portion, and with the protruding section 19 that designates the tip section 19a positioned the most inward of the opening 14 as a top portion, as illustrated in FIG. 7C, an inverse tapered shape is formed between the opening portion upper edge 16a and the tip section 19a of the protruding section 19 and a tapered shape is formed between the tip section 19a of the protruding section 19 and the opening portion lower edge 16b. For this reason, the opening 14, after once having a diameter reduction from the opening portion upper edge 16a towards the opening portion lower edge 16b such that the opening area becomes relatively small, has a diameter expansion such that the opening area becomes relatively large.

The opening end surface 16 is formed from an upper inclined surface 17 that connects the tip section 19a of the protruding section 19, the tip section 19a positioned most inward of the opening 14, and the opening portion upper edge 16a and a lower inclined surface 18 that connects the tip section 19a and the opening portion lower edge 16b. In the present embodiment, by providing the protruding section 19 from the opening portion upper edge 16a to the opening portion lower edge 16b, the protruding section 19 is formed from the upper inclined surface 17 and the lower inclined surface 18.

Further, the protruding section 19 is formed so that $\theta1$ is 43° or less, where $\theta1$ is an acute angle defined between the upper inclined surface 17 and a plane parallel to the substrate surface of the substrate 200.

More specifically, in the present embodiment, when viewed from a cross-sectional direction of the mask substrate 12, when the opening portion upper edge 16a is designated as point A1, when the tip section 19a of the protruding section 19 is designated as point A2, and when the point overlapping the opening portion upper edge 16a in the plane L1 parallel to the substrate 200 passing through the tip section 19a of the protruding section 19 is designated as point A3, $\theta1$ indicates the angle defined between point A1 and point A3 at point A2, and the alternate-interior angle and the corresponding angle are also indicated by $\theta1$.

Further, by designating the acute angle defined between the lower inclined surface 18 and the plane parallel to the substrate surface (specifically, the film-formation surface 200a) of the substrate 200 as $\theta2$, the protruding section 19 is formed such that $\theta2$ is at most 43°.

More specifically, in the present embodiment, when viewed from the cross-sectional direction of the mask substrate 12, when the tip section 19a of the protruding section 19 is designated as point A2, when the opening portion lower edge 16b is designated as point A4, and when the point overlapping the tip section 19a of the protruding section 19 in the film-formation surface 200a of the substrate 200 is designated as point A5, the angle defined between point A4, and point A5 at point A2 is indicated by $\theta2$; put another way, $\theta2$ indicates the angle defined between the lower inclined surface 18 and the film-formation surface 200a in the substrate 200, and the alternate-interior angle and the corresponding angle are also indicated by $\theta2$.

Below, a more detailed explanation is provided.

Figure 3:
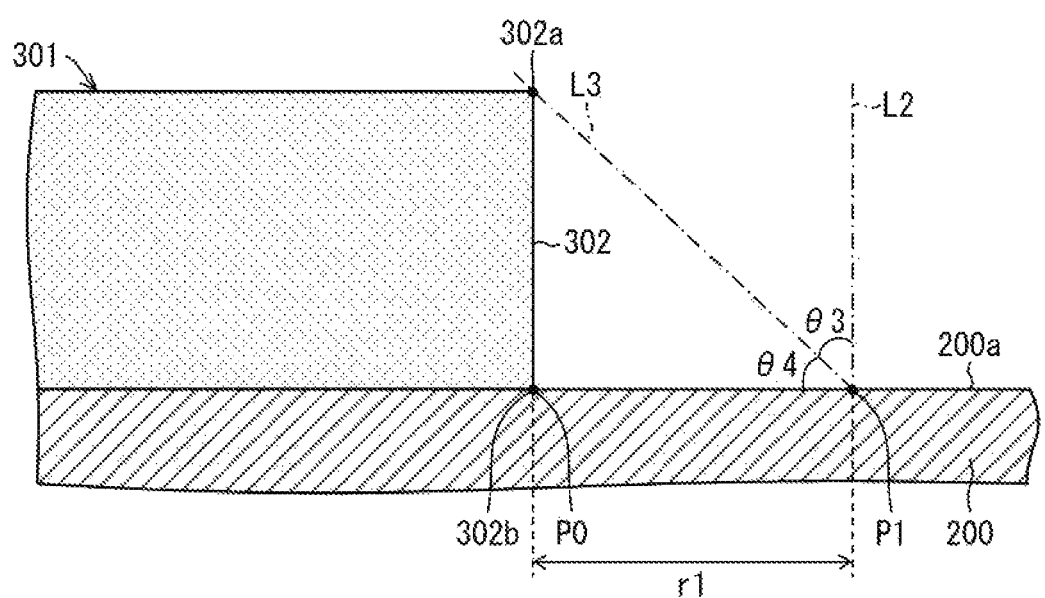
FIG. 3 is a schematic view for explaining a film formation cone angle θ3 when film formation is performed using a mask, the opening end surface of which is perpendicular to a mask surface.

FIG. 3 is a schematic diagram explaining the film formation cone angle $\theta3$ when film formation is performed using a mask 301, the opening end surface 302 of which is perpendicular to the mask surface.

When performing film formation by disposing the mask 301 on the substrate 200, in the vicinity of the opened end surface 302 of the mask 301, the mask 301 becomes an obstacle, and the film thickness of the film formed on the substrate 200 becomes thin.

Therefore, the mask 301 was used to measure the distance r1 from the mask edge P0 (mask opening edge) to the 90% film thickness position P1 and the film formation cone angle $\theta3$.

Here, the mask edge P0 is an opening end surface in plan view, and in the mask 301, it indicates the opening portion lower edge 302b. Further, the 90% film thickness position P1 indicates a position (more specifically, a position at which a film thickness of 90% at the central part of the film to be formed can be obtained) at which 90% film thickness (hereinafter written as "90% film thickness") of the set film thickness, this being the film thickness lower limit value ensuring sealing performance, can be obtained. If 90% film thickness is secured, sufficient sealing performance can be obtained.

In addition, the film formation cone angle $\theta3$ is an angle involved in film formation, and it indicates an angle defined between plane L3 passing through the opening portion upper edge 302a of the mask 301 and the 90% film thickness position P1 and plane L2 perpendicular to the substrate surface of the substrate 200 passing through the 90% film thickness position P1, and the alternate-interior angle and the corresponding angle are also indicated by $\theta3$.

Measurements were performed a plurality of times changing the mask 301 and the average value thereof was calculated. In all of the measurements, a mask 301 having a film thickness of 100 μm was used, and the film thickness was measured with a probe-type step profiler; the results are illustrated in Table 1.

TABLE 1

| Sample No. | r1 (μm) | θ3 (°) |
| --- | --- | --- |
| 1 | 62 | 42 |
| 2 | 72 | 46 |
| 3 | 82 | 50 |
| 4 | 80 | 49 |
| Average | 74 | 47 |

Figure 4:
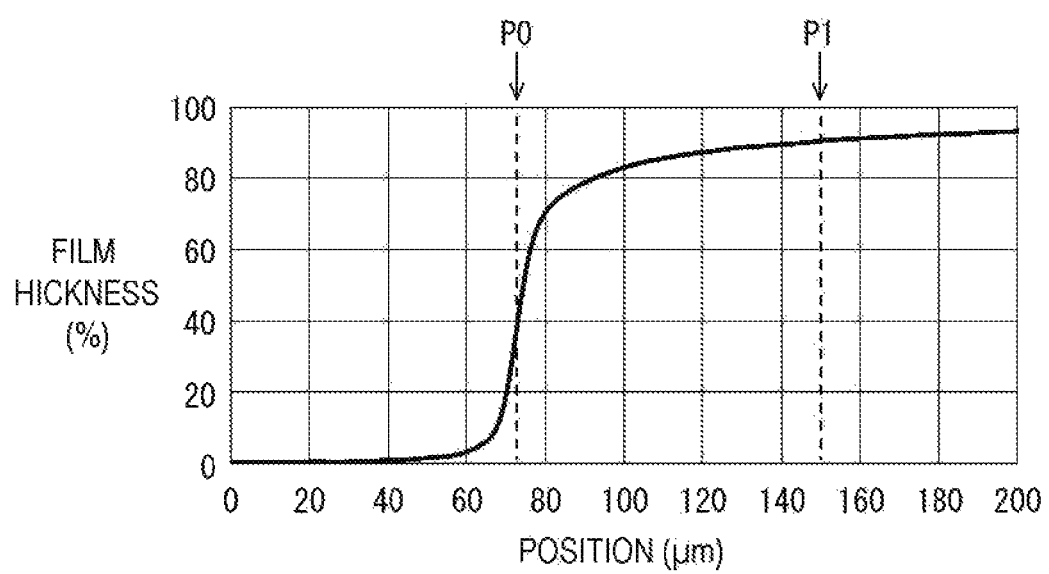
FIG. 4 is a graph illustrating an average profile of film thickness of a sealing film formed using the mask, the opening end surface of which is perpendicular to the mask surface.

In addition, the average profile of the film thickness of the sealing film 130 obtained at this time is illustrated in FIG. 4. FIG. 4 is a graph illustrating the average profile of the film thickness of the formed sealing film by using the mask 301. In addition, in FIG. 4, when viewed from the cross-sectional direction of the mask 301, the place where the film thickness change rate is the largest was defined as the mask edge P0.

From Table 1 and FIG. 4, the average value of the film formation cone angle θ3 is understood as being 47°. Here, when designating the maximum taper angle of the mask 301 as θ4, defined between plane L3 passing through the opening portion upper edge 302a of the mask 301 and the 90% film thickness position P1 and plane L2 passing through the 90% film thickness position Pt and the mask edge P0, the maximum taper angle θ4 is a complimentary angle of the film formation cone angle θ3, so it is defined as θ4=90°−θ3. For this reason, when the film formation cone angle θ3 is 47°, the maximum taper angle θ4 is 43°. In addition, the alternate-interior angle and the corresponding angle are also indicated by θ4.

Further, the thickness of the mask 301 was altered, and in the same way, the average value of the film formation cone angle θ3 was investigated, and results similar to those displayed in Table 1 were obtained. These results are displayed in Table 2.

TABLE 2

| Mask Thickness | r1 (μm) | θ3 (°) | θ4 (°) |
| --- | --- | --- | --- |
| 160 | 168 | 47 | 43 |
| 270 | 224 | 40 | 50 |
| 380 | 366 | 44 | 46 |

As illustrated in FIG. 3, when using the mask 301 wherein the opening end surface 302 is a vertical edge surface, the position at which the plane L3, which is the flying path of the film-forming material flying at the maximum taper angle θ4 (43°), is in contact with the opening end surface 302 of the mask 301, becomes the opening portion upper edge 302a of the mask 301. That is, a film having the 90% film thickness is formed at a position where the plane L3 passes through the opening portion upper edge 302a of the mask 301 and intersects the film-formation surface 200a.

On the other hand, according to the present embodiment, by making θ1 at 43° or less, as illustrated in FIGS. 1A and 1B, the position at which the plane L3, which is the flying path of the film-forming material flying at the maximum taper angle θ4 (43°) with respect to the film-formation surface 200a of the substrate 200, makes contact with the opening end surface 16 of the mask substrate 12 is not the opening portion upper edge 16a, but rather, it is the tip section 19a of the protruding section 19, the tip section 19a positioned more inward of the opening 14 than the opening portion upper edge 16a.

That is, if θ1 is made 43° or less, the position at which the film-forming material flying at the maximum taper angle θ4 (43°) collides with the mask substrate 12 with respect to the film-formation surface 200a can be shifted from the opening portion upper edge 302a of the mask 301 illustrated in FIG. 3 to the tip section 19a of the protruding section 19, as illustrated in FIGS. 1A and 1B.

Accordingly, if θ1 is 43° or less, the distance from the mask edge P0 to the 90% film thickness position P1 by the distance from the opening portion upper edge 16a to the tip section 19a of the protruding section 19 in plan view can be shortened. Therefore, the critical value of θ1 is 43°, which is the maximum taper angle θ4.

Further, in the present embodiment, as illustrated in FIG. 1B, film-forming particles also fly to a portion below the lower inclined surface 18 of the mask substrate 12, so a sealing film 130 is also formed as a deposited film at the portion below the lower inclined surface 18 of the mask substrate 12.

In other words, in this embodiment, by making θ1 to, for example, 43°, a sealing film 130 having the 90% film thickness is formed on an extended line of the upper inclined surface 17 of the mask substrate 12. Similarly, as illustrated in FIG. 1B, at a position P2 where plane L4 intersects with the film-formation surface 200a of the substrate 200, the plane L4 having an inclined angle θ4 (43°) with respect to the film-formation surface 200a of the substrate 200 and extending to a lower side of the lower inclined surface 18 of the mask substrate 12 through the tip section 19a of the protruding section 19, a sealing film 130 having the 90% film thickness is formed. Therefore, it is possible to form the sealing film 130 having the 90% film thickness with sufficient sealing performance in the vicinity of the mask edge P0.

On the other hand, in the side deeper than the position P2 (that is, a side of the mask substrate 12), the film thickness is 10% or less.

Accordingly, by making θ2 at, for example, 43° or less, and when the height from the film-formation surface 200a of the substrate 200 to the tip section 19a of the protruding section 19 is designated by h2, the film thickness of the sealing film 130 to be formed is at least 10% or less of a set value at a point where it enters a side of the mask substrate 12 by a width of h2×1/tan 43° from the tip section 19a of the protruding section 19 in plan view.

Furthermore, as film-forming particles are less likely to enter a side of the mask substrate 12 below the lower inclined surface 18, toward the opening portion lower edge 16b where the mask substrate 12 and the substrate 200 are in contact, the the thickness of the sealing film 130 to be formed decreases asymptotically.

As illustrated by α1 in FIG. 1A, the film-forming particles are more likely to be blocked below the lower inclined surface 18 on a side of the mask substrate 12 than on the plane L4. Specifically, 90% of the film-forming particles are blocked below the lower inclined surface 18, and when viewed from the cross-sectional direction of the mask substrate 12, wherein at a distance r2 between the position P2 where the plane L4 intersects with the film-formation surface 200a of the substrate 200 and the opening portion lower edge 16b, the sealing film 130 is slightly formed at a film thickness of 10% or less of the set value.

For this reason, in the vicinity of the opening portion lower edge 16b, the film thickness of the sealing film 130 to be formed is sufficiently small, and the sealing film 130 on the upper inclined surface 17 and the sealing film 130 on the substrate 200 are not continuous with one another.

Accordingly, according to the present embodiment, even in the vicinity of the mask edge P0, it is possible to form a sealing film 130 with 90% film thickness securing sealing performance, and by making θ2 43° or less, it is possible to form a sealing film 130 having sufficient sealing performance to the edge portion of the sealing film 130 on the substrate 200.

In addition, according to the present embodiment, by making θ2 43° or less, the sealing film 130 on the upper inclined surface 17 and the sealing film 130 on the substrate 200 are not continuous with one another, and when removing the mask 11 from the substrate 200, no film peeling occurs.

For this reason, after separating the mask 11 from the substrate 200, even in cases of continuous film formation, the peeled sealing film 130 is not mixed into the sealing film 130 to be formed later. Therefore, it is possible to form the sealing film 130 having ensured reliability.

For the above reasons, according to the present embodiment, it is possible to prevent the deterioration of sealing performance and film peeling in the vicinity of the mask edge P0 and to form a high-performance sealing film 130.

Below, making reference to FIGS. 5A to 5C and FIGS. 6A and 6B, the effects obtained by making θ1 and θ2 43° or less are explained in more detail.

FIGS. 5A to 5C and FIGS. 6A and 6B are drawings that explain the effects of the mask 11 according to the present embodiment. FIG. 5A is a cross-sectional view illustrating a schematic configuration of a main part of the mask 11 according to the present embodiment together with a distance r1 from the mask edge P0 of the mask 11 to the 90% film thickness position P1. Further, FIG. 5B is a cross-sectional view illustrating the schematic configuration of the main part of the mask 301 together with the distance r1 from the mask edge P0 of the mask 301 to the 90% film thickness position P1.

Further, in the mask 11, the mask edge P0 is the position of the mask edge surface positioned most inward in plan view, and when viewed from the cross-sectional direction of the mask substrate 12, illustrates the position on the substrate 200 superimposed with the tip section 19a of the protruding section 19.

As illustrated in FIG. 5B, when the thickness of the mask 301 is designated as dm, when the opening end surface 16 is a vertical surface (vertical edge surface), $r1=dm \times 1/\tan \theta4$, and the thickness of the mask 301 is involved in the distance r1 from the mask edge P0 to the 90% film thickness position P1. Similarly, when $\theta4 \leq \theta1$, $r1=dm \times 1/\tan \theta4$, and the thickness of the mask 301 is involved in the distance r1 from the mask edge P0 to the 90% film thickness position P1.

On the other hand, as illustrated in FIG. 5A, when designating the thickness of the mask substrate 12 as dm, when designating the height from the tip section 19a of the protruding section 19 to the opening portion upper edge 16a of the mask substrate 12 as h1, and when designating the height from the opening portion lower edge 16b to the tip section 19a of the protruding section 19 (that is, the height from the film-formation surface 200a in the substrate 200 to the tip section 19a of the protruding section 19) as h2, when $\theta1 \leq \theta4$, $r1=h2 \times 1/\tan \theta4$, and the thickness of the mask substrate 12 is not involved in the distance r1 from the mask edge P0 to the 90% film thickness position P1.

Further, in this embodiment, a sealing film 130 having sufficient sealing performance with a 90% film thickness is formed on the mask edge P0. For this reason, h2, in accordance with the thickness of the film to be formed, is a height equal to or greater than the thickness of the film to be formed, and preferably, it is set to become higher than the thickness of the film to be formed. If the thickness of the film to be formed is greater than the height h2 from the film-formation surface 200a to the tip section 19a of the protruding section 19, the film formed on the substrate 200 and the film formed on the upper inclined surface 17 of the mask substrate 12 might be continuous with one another. Therefore, it is preferable that the position of the tip section 19a of the protruding section 19 be set so that h2 reaches a height that is equal to or greater than the thickness of the film to be formed. When the film to be formed is the sealing film 130, h2 is desirably, for example, 5 μm or more.

On the other hand, if the position of the tip section 19a of the protruding section 19 becomes too high, the area of the sealing film 130 deposited to be equal to or larger than the size of the opening 14 in plan view—that is, the area of the sealing film 130 deposited below the lower inclined surface 18 of the mask substrate 12—becomes large.

Therefore, if the position of the tip section 19a of the protruding section 19 becomes too high, ineffective regions that are not involved with sealing performance increase in the sealing film 130, which causes a deterioration of the narrow frame design. Accordingly, h2 is preferably set to 500 μm or less, for example. By making h2 at 500 μm or less, if the film-forming cone angle θ3 is made 47°, then the width where the film thickness of the sealing film 130 can be from 10% to 90% of the set film thickness can be held to 538 (=500×1/tan 43°) μm.

Further, h1 and h2 can be h1>h2 and θ1 and θ2 can be θ1<θ2.

θ1 and θ2 are larger than 0°, as the tip section 19a of the protruding section 19 is positioned more inward of the opening 14 than the opening portion upper edge 16a and the opening portion lower edge 16b, and further, the lower limits of θ1 and θ2 are defined by making h2 a height equal to or greater than the thickness of the film to be formed, though at this time, when considering the mechanical strength of the mask substrate 12, preferably, θ1 and θ2 are, respectively, 15° or greater.

In addition, the distance (r1+r2) from the tip section 19a of the protruding section 19 in plan view to the opening portion lower edge 16b changes in accordance with the height of the tip section 19a of the protruding section 19. For this reason, the distance (r1+r2), though it is not particularly limited, when considering the effects on the narrow frame design, 1 mm or less is preferable.

Further, FIG. 5C is a cross-sectional view illustrating a schematic configuration of a main part of the mask 301 together with a range α2 involved in film formation in the vicinity of the mask 301.

In low temperature plasma CVD, in which film formation is performed at a low temperature of 100° C. or less, the film-forming reaction on the substrate surface proceeds with difficulty, and the gas does not easily enter minute gaps. Therefore, during film formation, a shadow is generated by the mask 301. That is, the flow of film-forming particles and gas is blocked by the mask 301, and as described above, the film thickness decreases near the mask edge P0.

When the opening end surface 302 of the mask 301 is flat, and where mask 301 is used wherein the opening end surface 302 of the mask 301 is perpendicular to the mask surface (that is, the principal surface of the mask 301), the range α2 involved in the film formation in the vicinity of the open edge P0 of the mask 301 is as illustrated in FIG. 5C, and the shadow becomes conspicuous.

Further, FIG. 6A is a cross-sectional view that illustrates a schematic configuration of a main part of the mask 11 according to the present embodiment together with a film (hereinafter written as "base film 201") that forms a lower layer of the sealing film 130 in the film-formation surface 200a of the substrate 200. In addition, FIG. 6B is a cross-sectional view illustrating a schematic configuration of a main part of the mask 301 together with the base film 201 on the film-formation surface 200a of the substrate 200, and FIGS. 6C and 6D are main part cross-sectional views that illustrate an example of a corner portion of the mask 301 where the base film 201 is susceptible to scratches in region B illustrated in FIG. 6B.

As illustrated in FIG. 6B, when the opening end surface 302 of the mask 301 is flat, if distortions as illustrated in FIG. 6C or burrs 303 as illustrated in FIG. 6D are present in the opening portion lower edge 302b of the mask 301, then the base film 201 positioned at an edge surface portion of the sealing film 130 may be damaged by the opening portion lower edge 302b (that is, the corner portion) of the mask 301.

Further, if the base film 201 is scratched or damaged by the distortions or burrs 303 of the opening portion lower edge 302b of the mask 301 or the like, there is a possibility of oxygen, moisture, or the like penetrating into the interior of the substrate 200, for example, the organic EL element 120 formed on the substrate 200 from the outside via the base film 201 from the scratch.

However, as illustrated in FIG. 6A, by providing the opening end surface 16 of the mask substrate 12 with the lower inclined surface 18, the opening portion lower edge 16b of the mask substrate 12 can be made obtuse, so the base film 201 may not be damaged. In addition, as illustrated in FIG. 6A, by providing the opening end surface 16 of the mask substrate 12 with the lower inclined surface 18, as illustrated in FIG. 6B, burrs are less likely to occur than in a configuration where the opening end surface 302 of the mask 301 comprises a vertical angle, and there is also the benefit that burrs do not easily dig into the base film 201.

Manufacturing Method of Mask 11

Next, the manufacturing method of the mask 11 is explained.

Although the material of the mask 11 is not particularly limited, for example, invar (iron-nickel alloy) having a small thermal expansion coefficient, stainless steel (SUS) excellent in corrosion resistance, or the like is suitably used. Further, the mask substrate 12 and the mask frame 13 are preferably formed from the same material in order to match the thermal expansion coefficients, but different materials may be used.

The opening 14 in the mask substrate 12 can be formed by machining, etching, laser light irradiation, and the like. At this time, it is possible to alter the shape of the opening end surface 16 through machining, etching, laser light irradiation, and the like.

FIGS. 7A to 7C are cross-sectional views illustrating an example of a method of manufacturing the mask 11 according to the present embodiment in the order of the steps.

First, as illustrated in FIG. 7A, a photoresist 210 is applied to both surfaces of a raw fabric of the mask substrate 12 (that is, the mask substrate 12 before forming the opening 14). Further, for the raw fabric, for example, a steel plate raw such as an invar material having a small thermal expansion coefficient is used. Subsequently, the photoresist 210 is exposed and developed, and an opening portion 211 in the photoresist 210 is pattern formed at a position corresponding to the opening 14 of the mask substrate 12.

Next, as illustrated in FIG. 7B, the opening 14 is formed in the raw fabric by wet etching the raw fabric using the patterned photoresist 210 as a mask. At this time, by immersing the raw fabric in an etching solution, isotropic etching occurs in the raw fabric in the opening portion 211 of the photoresist 210.

As the raw fabric is etched from both surfaces to which the photoresist 210 is applied, by adjusting the etching time, as illustrated in FIG. 7B, the protruding section 19 comprising the upper inclined surface 17 and the lower inclined surface 18 is formed on the opening end surface 16 of the mask substrate 12. Further, θ1 and θ2 can be appropriately changed by adjusting the etching time.

Next, as illustrated in FIG. 7C, the photoresist 210 may be peeled off to form the mask substrate 12, wherein the upper inclined surface 17 and the lower inclined surface 18 are formed at the opening end surface 16 of the mask substrate 12. Further, the position of the up/down direction of the protruding section 19 can be adjusted by changing the pattern opening amount of the photoresist 210 above and below the mask substrate 12.

Finally, the mask substrate 12 on which the opening 14 is formed is tension welded to a mask frame 13 (see FIGS. 2A and 2B) made of, for example, an invar material, like the mask substrate 12. Through this, the mask 11 according to the present embodiment is manufactured.

Alternate Example 1 of the Manufacturing Method of the Mask 11

Further, in FIGS. 7A to 7C, a case where the mask substrate 12 is formed by one layer is described as an example. However, the mask substrate 12 may also be formed by a plurality of layers.

Figure 9A:
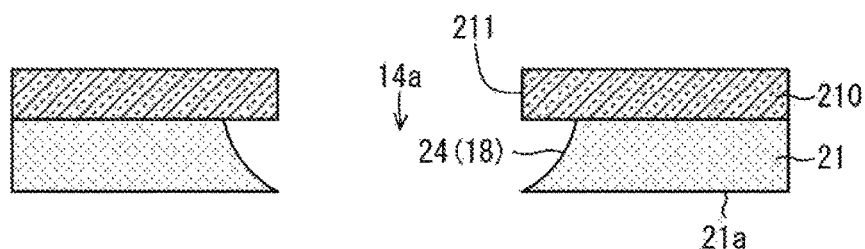
FIGS. 9A to 9C are cross-sectional views illustrating another example of the mask manufacturing method according to embodiment 1 of the present invention in the order of steps.
Figure 9B:
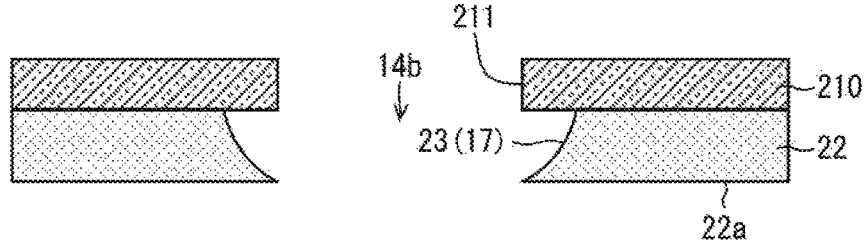
Figure 9C:
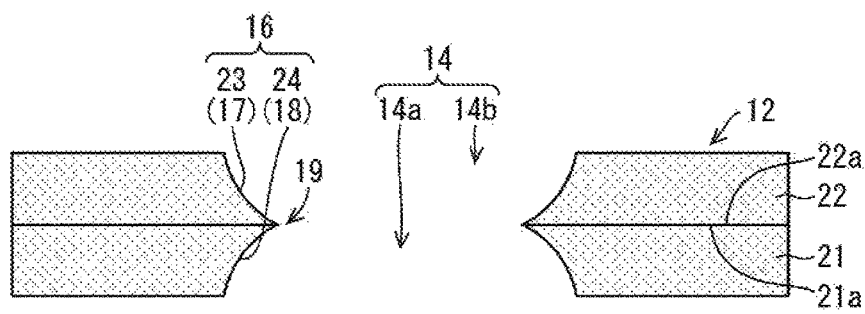

FIGS. 9A to 9C are cross-sectional views illustrating another example of the method for manufacturing the mask 11 according to the present embodiment in the order of steps.

In this example, as illustrated in FIG. 9C, a mask substrate 12 comprising a layered structure of a substrate 21 with a substrate 22 and an opening 14 having an opening 14a formed on the substrate 21 and an opening 14b formed on the substrate 22 is manufactured.

In this example, first, as illustrated in FIG. 9A, the photoresist 210 is applied to one surface of a raw fabric of the substrate 21 (that is, the substrate 21 before the opening 14a is formed) forming the mask substrate 12. Subsequently, the photoresist 210 is exposed and developed, and an opening portion 211 in the photoresist 210 is pattern formed at a position corresponding to the opening 14 of the mask substrate 12.

Next, using the patterned photoresist 210 as a mask, an etching solution is applied in a shower form from the upper surface side of the raw fabric of the substrate 21—that is, from the photoresist side 210—and the raw fabric is wet etched, thus forming the opening 14a in the raw fabric.

In this example, as isotropic etching is performed from the upper surface side of the raw fabric of the substrate 21, etching of the raw fabric progresses from a side of the photoresist 210. For this reason, the opening diameter of a side of the photoresist 210 of the substrate 21 is larger than the opening diameter of a side of a lower surface 21a where the photoresist 210 is not provided. Through this, the opening end surface 23 of the substrate 21 becomes an inclined surface. Subsequently, the inclined surface becomes the lower inclined surface 18.

On the other hand, as illustrated in FIG. 9B, the photoresist 210 is applied to one surface of the raw fabric of the substrate 22 (that is, the substrate 22 before forming the opening 14b) forming the mask substrate 12, and in the same way as the substrate 21, the raw fabric is wet etched, forming the opening 14b in the raw fabric.

In the same way as the raw fabric of the substrate 21, the raw fabric of the substrate 22 has isotropic etching performed thereon from an upper surface side, so the etching of the raw fabric progresses from a side of the photoresist 210. For this reason, in the same way as the substrate 21, with the substrate 22, the opening diameter of a side of the photoresist 210 is larger than the opening diameter of a side of a lower surface 22a where the photoresist 210 is not provided. Through this, the opening end surface 24 of the substrate 22 also becomes an inclined surface. Subsequently, the inclined surface becomes the upper inclined surface 17.

Next, as illustrated in FIG. 9C, the photoresist 210 in the substrate 21 and the substrate 22 is peeled, the surface 21a and the surface 22a respectively on the side opposite to the formation surface of the photoresist 210 in the substrate 21 and the substrate 22 are bonded to each other. In the bonding, for example, spot welding or the like is used. Through this, the mask substrate 12 comprising a layered structure of the substrate 21 with the substrate 22 is manufactured.

Also in this example, θ1 and θ2 can be appropriately changed by adjusting the etching time. On the other hand, the position in the up/down direction of the protruding section 19 can be adjusted by changing the thickness of the substrate 21 and the substrate 22.

Finally, the mask substrate 12 on which the opening 14 is formed is tension welded to a mask frame 13 (see FIGS. 2A and 2B) made of, for example, an invar material, like the mask substrate 12. Through this, the mask 11 according to the present embodiment is manufactured.

According to the present example, by bonding a plurality of substrates, reinforcement and suppression of deformation of the mask substrate 12 become possible.

In this example, a case where the same material is used for the substrate 21 and the substrate 22 is described as an example, but the substrate 21 and the substrate 22 can be formed from respectively different materials.

For example, a resin-made substrate may be used for one of the substrate 21 and the substrate 22 and a metal substrate can be used for the other.

Alternate Example 2 of the Manufacturing Method of the Mask 11

In FIGS. 7A to 7C and FIGS. 9A to 9C, an example where the protruding section 19 is formed through etching is explained.

However, the present embodiment is not limited to this. When the opening 14 is formed through laser irradiation, for example, by adjusting the irradiation position of the laser and the irradiation energy and by gradually changing the irradiation position of the laser, it is possible to form the protruding section 19 through laser irradiation.

Alternate Example 1 of the Shape of the Opening End Surface 16 of the Mask Substrate 12

Further, in the present embodiment, a case where the protruding section 19 comprises a tapered shape with the opening portion upper edge 16a and the opening portion lower edge 16b as a hem portion is explained. However, the present embodiment is not limited to this, and it may comprise a tapered shape having a position separated from at least one of the opening portion upper edge 16a and the opening portion lower edge 16b as a base.

Such a protruding section 19, for example, can easily be manufactured by bonding the substrate having the protruding section 19 manufactured by the method illustrated in FIGS. 7A to 7C and FIGS. 9A to 9C with a substrate, the opening end surface of which is a vertical edge surface.

Alternate Example 2 of the Shape of the Opening End Surface 16 of the Mask Substrate 12

Further, in the present embodiment, a case where the protruding section 19 comprises a continuous tapered shape (that is, a tapered shape with a continuously contracting diameter) is explained as an example. However, the present embodiment is not limited to this, and the protruding section 19 may comprise a stepped tapered shape in which the diameter decreases stepwise.

Embodiment 2

An explanation of other embodiments of the present invention based on FIG. 10 and FIGS. 11A to 11C is as follows. Further, in the present embodiment, differences from embodiment 1 will be explained, and components having the same functions as the components explained in embodiment 1 are denoted by the same reference numbers and explanations thereof have been omitted.

Configuration of the Mask Substrate 12

In embodiment 1, the protruding section 19 of the mask 11 is formed from the opening portion upper edge 16a to the opening portion lower edge 16b, and a case where the entirety of the opening end surface 16 of the mask 11 comprises a protruding shape that protrudes toward the inside of the opening 14 was explained.

However, it is not necessary that the protruding section 19 comprises a continuous tapered shape over the entire opening end surface 16 and it may be formed stepwise.

That is, the protruding section 19 is not necessarily inclined, and θ1 and θ2 may be defined by the stepwise corner portions.

The mask substrate 12 according to the present embodiment is formed by a plurality of substrates, and a portion above the tip section 19a of the protruding section positioned most inward of the opening 14 comprises an opening end surface (vertical edge surface) perpendicular to the substrate surface, and an opening end surface lower than the tip section 19a of the protruding section 19 comprises an inclined surface (inclined edge surface).

This is explained in more detail below.

Figure 10:
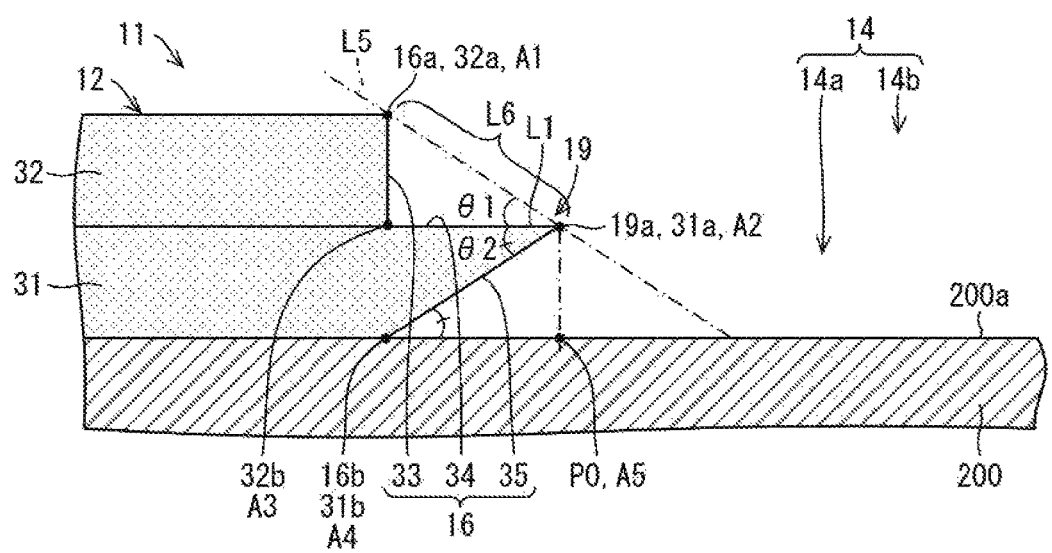
FIG. 10 is a cross-sectional view illustrating a configuration of the opening end surface of a mask substrate according to embodiment 2 of the present invention.

FIG. 10 is a cross-sectional view illustrating the configuration of the opening end surface 16 of the mask substrate 12 according to the present embodiment.

The mask substrate 12 according to the present embodiment comprises a layered structure of a substrate 31 with a substrate 32, wherein the mask substrate 12 is provided with the opening 14 that comprises the opening 14a formed on the substrate 31 and the opening 14b formed on the substrate 32. The substrate 31 and the substrate 32 are layered so that positions of respective opening centers (that is, the opening center of the opening 14a and the opening center of the opening 14b) are aligned in plan view.

The opening end surface 33 of the substrate 32 is a vertical surface perpendicular to the mask surface (that is, the principal surface of the mask substrate 12), and the opening end surface 35 of the substrate 31 is an inclined surface inclined toward the outside of the opening 14.

The substrate 32 is layered on the substrate 31, and the substrate 31 in a lower layer (that is, on a side of the substrate 200) protrudes more inward of the opening 14 than the substrate 32 in the upper layer. That is, in plan view, the opening 14a is formed one size smaller than the opening 14b.

Therefore, in the present embodiment, in a state where the substrate 31 and the substrate 32 are layered, the tapered protruding section 19 is formed by an upper surface 34 and the opening end surface 35 of the substrate 31 protruding more inward of the opening 14 than the substrate 32. In addition, the opening end surface 16 is formed from the opening end surface 33 of the substrate 32, the upper surface 34 protruding more inward of the opening 14 than the substrate 32 (more specifically, the opening portion lower edge 32b of the substrate 32) in the substrate 31, and the opening end surface 35. Accordingly, in the mask substrate 12 according to the present embodiment, a portion of the opening end surface 16 is provided with the tapered protruding section 19. Put a different way, a portion of the opening end surface 16 comprises a tapered shape.

Figure 11A:
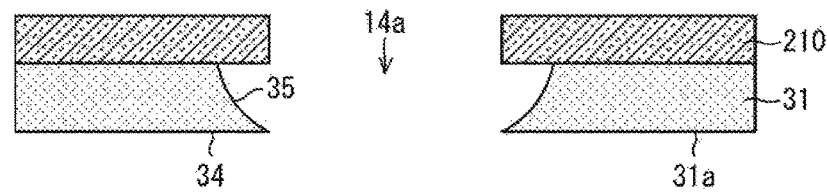
FIGS. 11A to 11C are cross-sectional views illustrating an example of a mask manufacturing method according to embodiment 2 of the present invention in the order of steps.
Figure 11B:
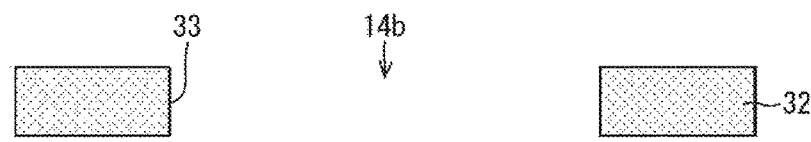
Figure 11C:
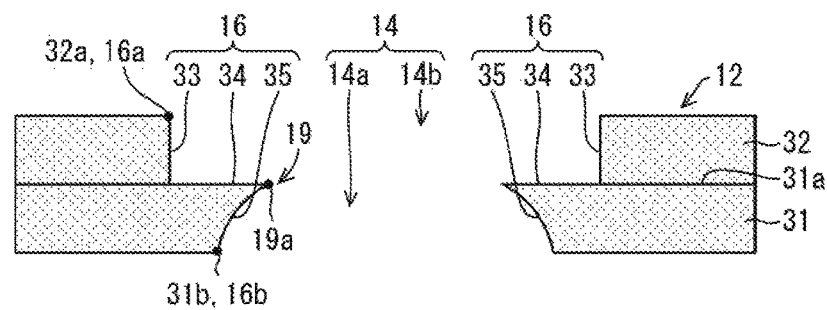

Therefore, in the present embodiment, the opening end surfaces 16 facing one another, as illustrated in FIG. 11C are parallel to each other between the opening end surfaces 33 facing each other on the substrate 32 and comprise a tapered shape between the opening end surfaces 35 facing each other on the substrate 31.

Accordingly, the opening 14b comprises a constant opening diameter and the opening 14a is reduced in diameter so that the opening area becomes relatively smaller than the opening 14b, after which, the diameter is expanded so that the opening area becomes relatively large.

In the present embodiment, θ1 and θ2 are defined by corner portions of the substrate 32 and the substrate 31, and similar to embodiment 1, θ1 and θ2 are made 43° or less.

In the present embodiment, θ1 is defined by an angle defined between plane L5 that passes through the opening portion upper edge 32a of the substrate 32, 32a forming the opening portion upper edge 16a in the opening end surface 16, and through the opening portion upper edge 31a of the substrate 31, 31a forming the tip section 19a of the protruding section 19, 19a positioned most inward of the opening 14, and by the upper surface 34 in the substrate 31.

More specifically, when viewed from the cross-sectional direction of the mask substrate 12, when designating the opening portion upper edge 16a as point A1, the tip section 19a of the protruding section 19 as point A2, and the opening portion lower edge 32b of the substrate 32 as point A3, θ1 represents the angle defined between point A1 and point A3 at point A2, and the alternate-interior angle and corresponding angle thereof are also represented by θ1.

Further, when viewed from the cross-sectional direction of the mask substrate 12, the upper surface 34 in the substrate 31 corresponds to plane L1 that is parallel to the substrate 200 passing through the tip section 19a of the protruding section 19. Further, the opening portion lower edge 32b of the substrate 32 corresponds to a point overlapping the opening portion upper edge 16a on the plane L1. In addition, portion L6, which connects the opening portion upper edge 16a in the opening end surface 16 and the tip section 19a of the protruding section 19 on the plane L5 corresponds to the upper inclined surface 17 in the mask substrate 12 illustrated in FIGS. 1A and 1B.

In addition, in the present embodiment, θ2 is defined as an acute angle defined between the opening end surface 35 of the substrate 31 and a plane parallel to the substrate surface of the substrate 200. Here, it should be noted that the opening end surface 35 of the substrate 31 corresponds to the lower inclined surface 18 in the mask substrate 12 illustrated in FIGS. 1A and 1B.

More specifically, when viewed from the cross-sectional direction of the mask substrate 12, when designating the tip section 19a of the protruding section 19 as point A2, when designating the opening portion lower edge 31b of the substrate 31, which forms the opening portion lower edge 16b, as point A4, and when designating the point overlapping with the tip section 19a of the protruding section 19 in the film-formation surface 200a of the substrate 200, the angle defined between point A4 and point A5 at point A2 is represented by θ2. Put another way, the angle defined between the opening end surface 35 of the substrate 31 and the film-formation surface 200a of the substrate 200, and the alternate-interior angle and corresponding angle thereof are also represented by θ2.

According to the present embodiment, θ1 and θ2 are made 43° or less, and through this, effects similar to those of embodiment 1 are obtainable. Further, according to the present embodiment, by making the opening end surface 33 of the upper layer substrate 32 to be a vertical surface, it is sufficient to form the inclined surface only in the lower layer substrate 31, and the manufacturing process can be simplified. Furthermore, according to the present embodiment, it is possible to reinforce the mask substrate 12 and suppress deformation of the mask substrate 12 by bonding a plurality of substrates.

Also in this embodiment, the mask edge P0 is a position of the mask edge surface positioned most inward when viewed in plan view, and when viewed from the cross-sectional direction of the mask substrate 12, this represents a position on the substrate 200 overlapping with the tip section 19a of the protruding section 19.

In addition, in the present embodiment, if the position of the opening portion lower edge 16b in the opening end surface 16 is set such that θ2 is 43° or less, in plan view, it can be positioned more inward of the opening 14 than the position of the opening portion upper edge 16a in the opening end surface 16, and it can be the same as the position of the opening portion upper edge 16a or it can be positioned on a side deeper than the opening portion upper edge 16a (a side of the mask substrate 12).

In any case, according to the present embodiment, the opening end surface 35 of the substrate 31 contacting the substrate 200 comprises an inclined surface, so the opening portion lower edge 16b of the mask substrate 12 can be made obtuse. For this reason, in embodiment 1, it is possible to obtain the same effects as the effects explained in FIG. 6A.

Manufacturing Method of Mask 11

Next, a method for manufacturing the mask 11 according to the present embodiment is explained.

FIGS. 11A to 11C are cross-sectional views illustrating an example of a method of manufacturing the mask 11 according to this embodiment in the order of steps.

In the present embodiment, as illustrated in FIG. 11A, a photoresist 210 is applied to one surface of the raw fabric of the substrate 31 (that is, the substrate 31 before the opening 14a is formed) forming the mask substrate 12, and in the same way as substrates 21 and 22 according to alternate example 1 of embodiment 1, the raw fabric is wet etched, leading to the formation of the opening 14a in the raw fabric.

In the same way as the raw fabric of the substrates 21 and 22, isotropic etching is performed from the upper surface side of the raw fabric of the substrate 31, so the etching of the raw fabric progresses from a side of the photoresist 210. In the same way as the substrates 21 and 22, with the substrate 31, also, the opening diameter of the side of the photoresist 210 is larger than the opening diameter on a side of the lower surface 31a where the photoresist 210 is not provided. As a result, the opening end surface 35 of the substrate 31 becomes an inclined surface.

On the other hand, as illustrated in FIG. 11B, an opening 14b in which the opening end surface 33 is a vertical surface, is formed on the substrate 32 by laser irradiation.

Next, as illustrated in FIG. 11C, the photoresist 210 on the substrate 31 is peeled off, and the surface 31a on the substrate 31 opposite to the formation surface of the photoresist 210 is bonded to the substrate 32. In the bonding, for example, spot welding or the like is used. Through this, the mask substrate 12 having a layered structure of the substrate 31 with the substrate 32 is manufactured.

In the present embodiment, θ1 can be adjusted by changing the width of the upper surface 34 of the substrate 31 protruding inward of the opening 14 more than the substrate 32. Accordingly, θ1 can be adjusted by changing the pattern opening amount of the photoresist 210.

In addition, as in the first embodiment, θ2 can appropriately be changed by adjusting the etching time. In addition, the position of the up/down direction of the protruding section 19 can be adjusted by changing the thickness of the substrate 31 and the substrate 32.

Finally, the mask substrate 12 on which the opening 14 is formed is tension welded to the mask frame 13 (see FIGS. 2A and 2B). Through this, the mask 11 according to the present embodiment is manufactured.

In addition, the substrate 31 and the substrate 32 can be formed by the same material or they can be formed by respectively different materials. For example, a resin substrate can be used on one of the substrate 31 and the substrate 32 and a metal substrate can be used on the other one. Further, the mask substrate 12 and the mask frame 13 can also be formed by the same material or can be formed by different materials.

Alternate Example 1

In FIG. 10, a case where the mask substrate 12 comprises a layered structure of the substrates 31 and 32 is explained as an example. However, the mask substrate 12 can comprise a structure formed from layering at least three substrates.

For example, two or more substrates having a vertical edge surface and having a different opening diameter from the adjacent substrate may be layered on the substrate 31, including the substrate 32. Accordingly, at least one protruding section 19 can be provided, but a plurality can also be provided.

In addition, in the configuration where two steps or more vertical edge surfaces are provided in this way, θ1 is defined as the largest angle of the acute angles defined between the plane passing through the tip section 19a of the protruding section 19 and the corner portion of the mask substrate 12 positioned above the tip section 19a of the protruding section 19 (that is, the corner portion of the substrate positioned above the tip section 19a of the protruding section forming the opening end surface 16) and the plane parallel to the substrate 200.

Alternate Example 2

Further, in the present embodiment, by layering a plurality of substrates, an example of the opening end surface 16 being provided with a stepwise corner portion is explained as an example. However, the present embodiment is not limited to this, and, for example, by adjusting the irradiating position or the irradiation energy of the laser or by applying nanoimprinting, it is possible to form the stepwise corner portion in the opening end surface 16 of one substrate.

Embodiment 3

An additional embodiment for carrying out the present invention is explained by making reference to FIG. 12 as follows. In this embodiment, differences from embodiments 1 and 2 are explained, and components having the same functions as the components explained in embodiments 1 and 2 are written with the same reference numbers and the explanations thereof have been omitted.

Configuration of the Mask Substrate 12

The mask 11 according to the present embodiment is different from the mask 11 according to embodiment 2 in that the mask substrate 12 is formed from at least three substrates and in that the substrate having the inclined edge surface is sandwiched between the substrates having the vertical edge surfaces.

This is explained in more detail below.

Figure 12:
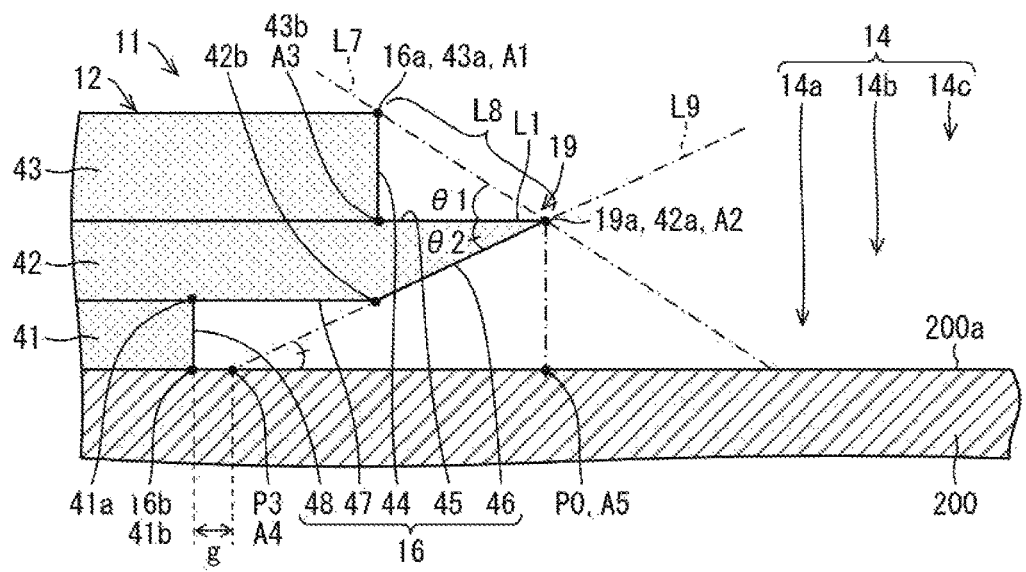
FIG. 12 is a cross-sectional view illustrating a configuration of an opening end surface of a mask substrate according to embodiment 3 of the present invention.

FIG. 12 is a cross-sectional view illustrating the configuration of the opening end surface 16 of the mask substrate 12 according to the present embodiment.

The mask substrate 12 according to the present embodiment comprises a layered structure of substrates 41-43, and the mask substrate 12 is provided with the opening 14 comprising the opening 14a formed on the substrate 41, the opening 14b formed on the substrate 42, and the opening 14c formed on the substrate 43. Further, also in the present embodiment, the substrates 41-43, viewed in plan view, are layered such that the respective positions of the center of the openings are aligned.

The opening end surface 48 of the substrate 41 and the opening end surface 44 of the substrate 43 are respectively vertical surfaces (vertical edge surfaces), and the opening end surface 46 of the substrate 42 is an inclined surface that is inclined toward the outside of the opening 14.

The substrate 41, the substrate 42, and the substrate 43 are layered in this order, and the substrate 42 protrudes more inward of the opening 14 than the substrate 43 in the upper layer and the substrate 41 in the lower layer.

In plan view, the opening 14c is formed one size smaller than the opening 14a and the opening 14b is formed one size smaller than the opening 14c. However, the size of the opening 14c and the size of the opening 14a can be reversed.

Therefore, in the present embodiment, in a state where the substrates 41-43 are layered, the tapered protruding section 19 is formed by the upper surface 45 of the substrate 42 protruding more inward of the opening 14 than the substrate 43 (more specifically, the opening portion lower edge 43b of the substrate 43) and the opening end surface 46. In addition, the opening end surface 16 is formed from the opening end surface 44 of the substrate 43, the upper surface 45 in the substrate 42 protruding more inward of the opening 14 than the substrate 43, the opening end surface 46, the lower surface 47 protruding more inward of the opening 14 than the substrate 41, and the opening end surface 48 of the substrate 41.

In the present embodiment, the opening end surfaces 16 facing one another are parallel to one another between the mutually opposing opening end surfaces 44 of the substrate 43 and between the mutually opposing opening end surfaces 48 of the substrate 41 and comprise a tapered shaped between the mutually opposing opening end surfaces 46 of the substrate 42.

As in the present embodiment, when the mask substrate 12 comprises a layered structure of at least three substrates, θ1 is defined as the largest angle of the acute angles defined between the plane passing through the tip section 19a of the protruding section 19 and the corner portion of the mask substrate 12 that is positioned above the tip section 19a of the protruding section 19 and that forms the opening end surface 16 and the plane parallel to the substrate surface of the substrate 200.

In addition, when the mask substrate 12 is formed by layering three or more substrates, θ2 is defined as the largest angle of the acute angles defined between the plane passing through the tip section 19a of the protruding section 19 and the corner portion of the substrate that is positioned below the tip section 19a and that forms the opening end surface 16 and a plane parallel to the substrate surface of the substrate 200.

That is, as a concept common to each embodiment, regardless of the number of substrates forming the mask substrate 12 and the edge surface shape, θ1 is defined as the largest angle of the acute angles defined between the plane passing through the tip section 19a of the protruding section 19 and the corner portion of the mask substrate 12 that is positioned above the tip section 19a and the plane parallel to the substrate surface of the substrate 200.

Put another way, when viewed from a side of the opening portion upper edge 16a of the opening end surface 16, θ1 is defined by the acute angle defined between a plane passing through a corner portion positioned most inward of the opening 14 of the corner portions including the opening portion upper edge 16a and the tip section 19a of the protruding section 19 in the opening end surface 16 and the corner portion positioned second most inward of the opening 14 (that is, the corner portions positioned the most inward and the second most inward of the opening 14) and a plane that is parallel to the film-formation surface 200a of the substrate 200.

Further, the term "viewed from a side of the opening portion upper edge 16a of the opening end surface 16" refers to a plan view from a side of the opening portion upper edge 16a of the opening end surface 16 and is not viewed in perspective.

Accordingly, when viewed from a side of the opening portion upper edge 16a of the opening end surface 16, the corner portion positioned most inward of the opening 14 in the opening end surface 16 refers to the tip section 19a of the protruding section 19 when viewed from a side of the opening portion upper edge 16a of the opening end surface 16 (more specifically, the upper edge of the tip section 19a of the protruding section 19), and the corner portion positioned second most inward of the opening 14 refers to a corner portion positioned most inward of the opening 14 when viewed from a side of the opening portion upper edge 16a of the corner portions of the mask substrate 12 positioned more toward the opening portion upper edge 16a than the tip section 19a.

In the same way, θ2 is defined by the largest angle of the acute angles defined between the plane passing through the tip section 19a of the protruding section 19 and the corner portion of the mask substrate 12 positioned below the tip section 19a and the plane parallel to the substrate surface of the substrate 200.

In other words, when viewed from a side of the opening portion lower edge 16b of the opening end surface 16, θ2 is defined by the acute angle defined between the plane passing through the corner portion positioned most inward of the opening 14 of the corner portions including the opening portion lower edge 16b side and the tip section 19a of the protruding section 19 in the opening end surface 16 and the corner portion positioned second most inward of the opening 14 (that is, the corner portions positioned the most inward and the second most inward of the opening 14) and a plane that is parallel to the film-formation surface 200a of the substrate 200.

Further, the term "when viewed from the opening portion lower edge 16b of the opening end surface 16" refers to a plan view from the opening portion lower edge 16b side of the opening end surface 16 and is not viewed in perspective.

Accordingly, when viewed from a side of the opening portion lower edge 16b of the opening end surface 16, the corner portion positioned most inward of the opening 14 in the opening end surface 16 refers to the tip section 19a of the protruding section 19 when viewed from a side of the opening portion lower edge 16b of the opening end surface 16 (more specifically, the lower edge of the tip section 19a of the protruding section 19), and the corner portion positioned second most inward of the opening 14 refers to a corner portion positioned most inward of the opening 14 when viewed from a side of the opening portion lower edge 16b of the corner portions of the mask substrate 12 positioned more toward the opening portion lower edge 16b side than the tip section 19a.

Therefore, in the present embodiment, θ1 is defined by an angle defined between a plane L7 that passes through an opening portion upper edge 43a of the substrate 43 forming the opening portion upper edge 16a in the opening end surface 16 and an opening portion upper edge 42a of the substrate 42 forming the tip section 19a of the protruding section 19 positioned most inward of the opening 14 and the upper surface 45 on the substrate 42.

More specifically, in the present embodiment, when viewed from the cross-sectional direction of the mask substrate 12, θ1 illustrates an angle defined between point A1 and point A3 at point A2 when designating the opening portion upper edge 16a as point A1, the tip section 19a of the protruding section 19 as point A2, and the opening portion lower edge 43b of the substrate 43 as point A3, and the alternate-interior angle and the corresponding angle thereof are also indicated by θ1.

When viewed from the cross-sectional direction of the mask substrate 12, the upper surface 45 on the substrate 42 corresponds to plane L1 that passes through the tip section 19a of the protruding section 19 and that is parallel to the substrate 200. Further, the opening portion lower edge 43b of the substrate 43 corresponds to the point overlapping the opening portion upper edge 16a on the plane L1. In addition, a portion L8 that connects the opening portion upper edge 16a in the opening end surface 16 and the tip section 19a of the protruding section 19 on the plane L7 corresponds to the upper inclined surface 17 in the mask substrate 12 illustrated in FIGS. 1A and 1B.

Further, in the present embodiment, θ2 is defined as an acute angle defined between a plane L9 (that is, an extension surface of the opening end surface 46) passing, along the opening end surface 46 of the substrate 42, through the tip section 19a of the protruding section 19 and the opening portion lower edge 42b of the substrate 42 positioned most inward of the opening 14 when viewed from a side of the opening portion lower edge 41b (that is, the opening portion lower edge 16b) of the opening portion lower edge 42b of the substrate 42 and the opening portion upper edge 41a and the opening portion lower edge 41b of the substrate 41, these being the corner portions of the mask substrate 12 positioned below the tip section 19a and a plane parallel to the substrate surface of the substrate 200. In addition, an imaginary surface extending the opening end surface 46 of the substrate 42 to a side of the substrate 200 corresponds to the lower inclined surface 18 in the mask substrate 12 illustrated in FIGS. 1A and 1B.

More specifically, in the present embodiment, when viewed from the cross-sectional direction of the mask substrate 12, θ2 indicates the angle defined between point A4 and point A5 at point A2 when the tip section 19a of the protruding section 19 is designated as point A2, when point P3 where the plane L9 intersects with the substrate 200 is designated as point A4, and when the point overlapping with the tip section 19a of the protruding section 19 in the film-formation surface 200a of the substrate 200 is designated as point A5, and the alternate-interior angle and the corresponding angle thereof are also indicated by θ2.

Also in the present embodiment, as θ1 and θ2 are set to be 43° or less, so it is possible to obtain the same effects as those obtainable from embodiment 1. Further, according to the present embodiment, the mask substrate 12 is formed from a plurality of substrates including the substrate 42 having an inclined edge surface, so it is possible to obtain the same effects as those obtainable from embodiment 2. Also in this embodiment, the mask edge P0 is a position of the mask edge surface positioned most inward when viewed in plan view, and when viewed from the cross-sectional direction of the mask substrate 12, this represents a position on the substrate 200 overlapping with the tip section 19a of the protruding section 19.

Also, in the present embodiment, the opening portion lower edge 41b of the substrate 41 adjacent to the substrate 200 is positioned on a deep side (a side of the mask substrate 12) more than point P3 where the plane L9 intersects with the substrate 200.

That is, in the present embodiment, the opening 14a is formed in the substrate 41 so as to have a gap g between point P3 and the opening portion lower edge 41b, and point P3 is positioned more inward of the opening 14 than the opening end surface 48 of the substrate 41. Therefore, film-forming particles may be deposited on the opening end surface 48 to suppress the continuous formation of a film between the opening end surface 48 and the substrate 200.

In addition, the mask substrate 12 can be manufactured through the same method as that of embodiment 2 by manufacturing a substrate having an inclined edge surface and a substrate having a vertical edge surface and by bonding each of the substrates. Accordingly, with the present embodiment and the below-described embodiment, the explanation of the manufacturing method for the mask 11 has been omitted.

Further, in the present embodiment, a case where the mask substrate 12 is formed from three layers is explained as an example. However, the present embodiment is not limited to this, and the mask substrate 12 can comprise a structure structure of four layers or more.

Embodiment 4

Figure 13:
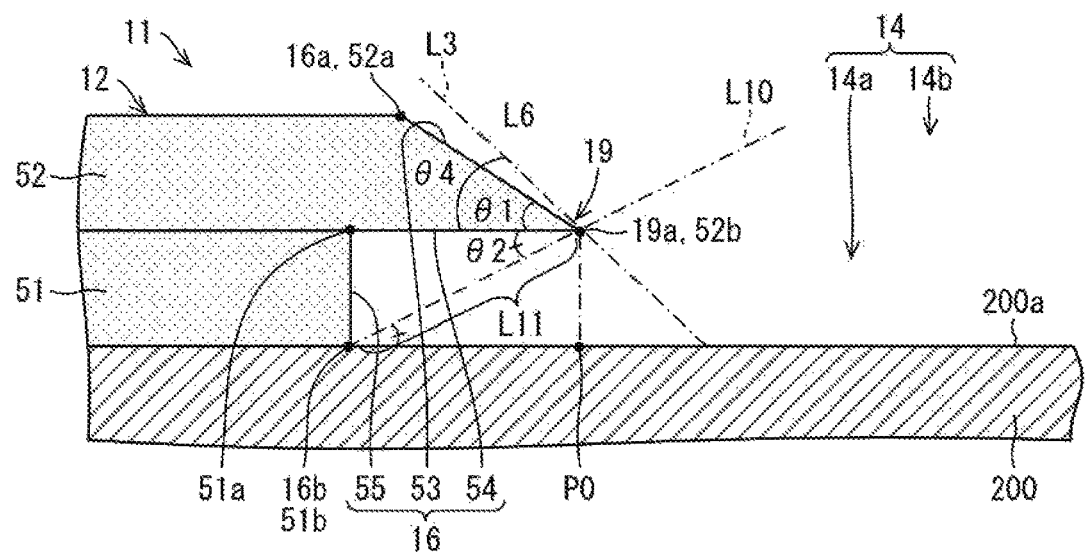
FIG. 13 is a cross-sectional view illustrating a configuration of an opening end surface of a mask substrate according to embodiment 4 of the present invention.

Concerning further embodiments for carrying out the present invention, an explanation in accordance with FIG. 13 is as follows. Further, in the present embodiment, differences from embodiments 1-3 are explained, and components having the same functions as the components explained in embodiments 1-3 are affixed with the same reference number and their explanations have been omitted.
Configuration of the Mask Substrate 12

The mask substrate 12 according to the present embodiment is different from the mask 11 according to embodiment 2 in that the lower portion of the tip section 19a of the protruding section 19 positioned most inward of the opening 14 comprises a vertical opening end surface (vertical edge surface) on the substrate surface and in that the opening end surface of an upper portion of the tip section 19a of the protruding section 19 comprises an inclined surface (inclined edge surface).

This is explained in more detail below.

FIG. 13 is a cross-sectional view illustrating the configuration of the opening end surface 16 of the mask substrate 12 according to the present embodiment.

The mask substrate 12 according to the present embodiment comprises a configuration in which the mask substrate 12 according to embodiment 2 is turned upside down.

The mask substrate 12 according to the present embodiment comprises a layered structure between the substrate 51 and the substrate 52 and the mask substrate 12 is provided with the opening 14 including the opening 14a formed on the substrate 51 and the opening 14b formed on the substrate 52. Further, also in the present embodiment, the substrate 51 and the substrate 52 are layered such that the positions of the respective opening centers are aligned in plan view.

The opening end surface 33 of the substrate 51 is a vertical surface (vertical edge surface) and the opening end surface 53 of the substrate 52 is an inclined surface inclined toward the interior of the opening 14.

The substrate 52 is layered on the substrate 51, and the substrate 52 in the upper layer protrudes more inward of the opening 14 than the substrate 32 in the lower layer. That is, in plan view, the opening 14b is formed one size smaller than the opening 14a.

Therefore, in the present embodiment, in a state where the substrate 51 and the substrate 52 are layered, the tapered protruding section 19 is formed from a lower surface 54 and the opening end surface 53 of the substrate 52 that protrudes inward of the opening 14 than the substrate 51. Further, the opening end surface 16 is formed by the lower surface 54 and the opening end surface 53 of the substrate 52 protruding more inward of the opening 14 than the substrate 51 (more specifically, the opening portion upper edge 51a of the substrate 51) and the opening end surface 55 of the substrate 51.

Therefore, in the present embodiment, the opening end surfaces 16 facing one another are parallel to one another between opposing opened end surfaces 55 in the substrate 51 and comprise a tapered structure between opposing opened end surfaces 53 in the substrate 52.

In this embodiment, θ1 is set similarly to θ1 in the mask substrate 12 in embodiment 1. Accordingly, in the present embodiment, descriptions concerning the setting of θ1 have been omitted. Further, in the present embodiment, when viewed from the cross-sectional direction of the mask substrate 12, the lower surface 54 in the substrate 52 corresponds to the plane L1 parallel to the substrate 200 passing through the tip section 19a of the protruding section 19. In addition, the opening end surface 53 of the substrate 52 corresponds to the upper inclined surface 17 in the mask substrate 12 illustrated in FIGS. 1A and 1B.

Further, in the present embodiment, θ2 is defined as an acute angle defined between a plane L10 that passes through the tip section 19a of the protruding section 19 and the opening portion lower edge 51b of the substrate 51, this being a corner portion of the mask substrate 12 positioned below the tip section 19a and a plane parallel to the substrate surface of the substrate 200. Further, when viewed from the cross-sectional direction of the mask substrate 12, a portion L1 on the plane L10 that connects the tip section 19a and the opening portion lower edge 51b forming the opening portion lower edge 16b corresponds to the lower inclined surface 18 in the mask substrate 12 illustrated in FIGS. 1A and 1B.

Also in the present embodiment, as θ1 and θ2 are set to be 43° or less, so it is possible to obtain the same effects as those obtainable from embodiment 1. Further, according to the present embodiment, the mask substrate 12 is formed from a plurality of substrates including the substrate 42 having an inclined edge surface, so it is possible to obtain the same effects as those obtainable from embodiment 2. Also in this embodiment, the mask edge P0 is a position of the mask edge surface positioned most inward when viewed in plan view, and when viewed from the cross-sectional direction of the mask substrate 12, this represents a position on the substrate 200 overlapping with the tip section 19a of the protruding section 19.

Embodiment 5

Figure 14A:
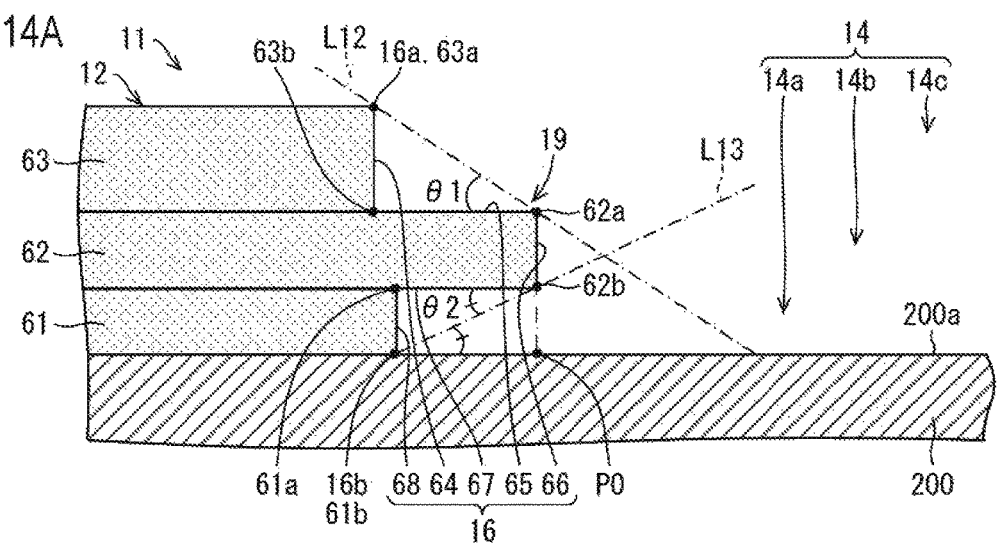
FIGS. 14A and 14B are cross-sectional views illustrating a configuration of an opening end surface of a mask substrate according to embodiment 5 of the present invention.
Figure 14B:
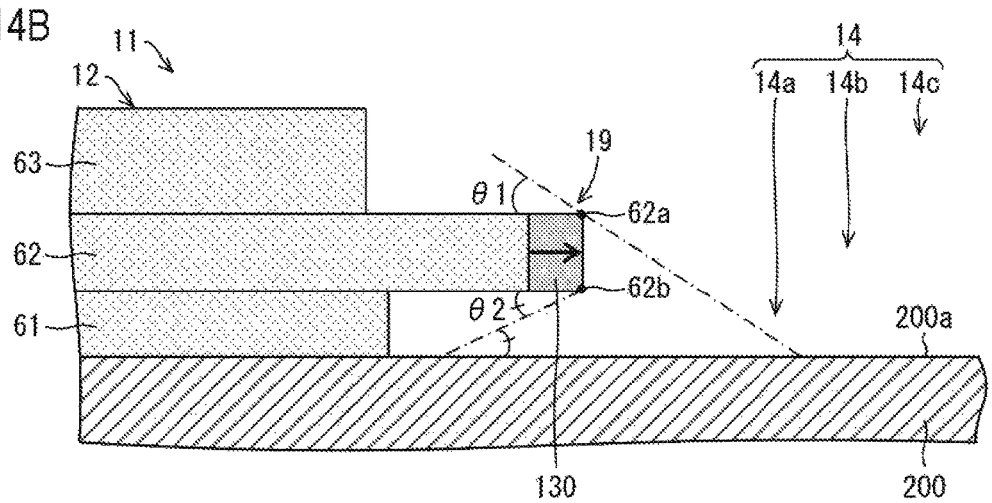
Figure 15:
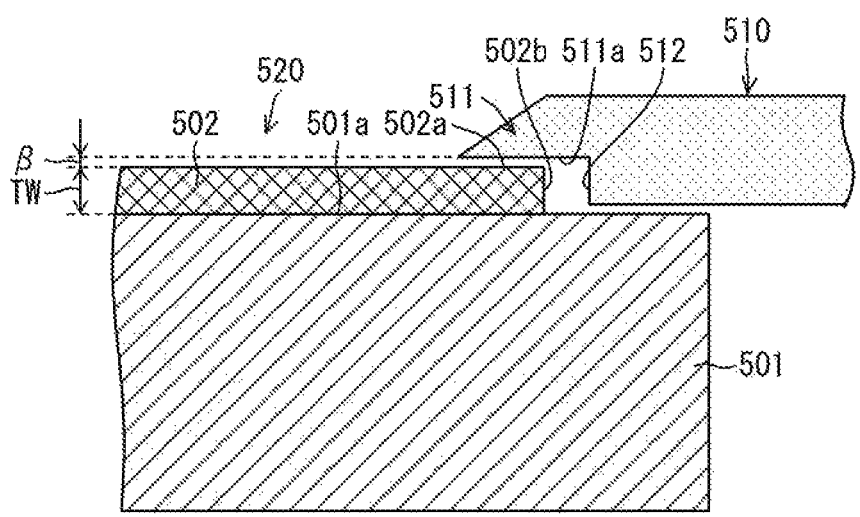
FIG. 15 is a cross-sectional view illustrating a schematic configuration of the main parts of the CVD) device described in PTL 1.

Concerning further embodiments for carrying out the present invention, an explanation based on FIGS. 14A and 14B is as follows. Further, in the present embodiment, differences with embodiments 1-4 are explained, and components having the same functions as those explained in embodiments 1-4 are affixed with the same reference numbers and the explanations thereof have been omitted.

Configuration of the Mask Substrate 12

In embodiments 1-4, a case where the opening end surface 16 comprises an inclined surface was explained as an example. However, the opening end surface 16 may comprise the protruding section 19 protruding more inward of the opening 14 than the opening portion upper edge 16a and the opening portion lower edge 16b, and it is not necessarily required to comprise the inclined surface.

The mask substrate 12 according to the present embodiment is different from the mask substrate 12 according to embodiment 3 in that it comprises a layered structure layering a plurality of substrates having vertical edge surfaces.

FIGS. 14A and 14B are cross-sectional views illustrating the configuration of the opening end surface 16 of the mask substrate 12 according to the present embodiment. Further, FIG. 14A illustrates the configuration of the opening end surface 16 of the mask substrate 12 before the formation of the sealing film 130, and FIG. 14B illustrates the configuration of the opening end surface 16 of the mask substrate 12 after the formation of the sealing film 130.

The mask substrate 12 according to the present embodiment comprises a layered structure of substrates 61-63, and the mask substrate 12 is provided with the opening 14 comprising the opening 14a formed on the substrate 61, the opening 14b formed on the substrate 62, and the opening 14c formed on the substrate 63. Further, also, in the present embodiment, substrates 61-63 are layered such that the positions of respective opening centers are aligned in plan view.

The opening end surface 68 of the substrate 61, the opening end surface 66 of the substrate 62, and the opening end surface 64 of the substrate 63 are respectively vertical surfaces (vertical edge surfaces).

The substrate 61, the substrate 62, and the substrate 63 are layered in this order, and the substrate 62 protrudes more inward of the opening 14 than the substrate 63 in the upper layer and the substrate 61 in the lower layer.

In plan view, the opening 14a is formed one size smaller than the opening 14c and the opening 14b is formed one size smaller than the opening 14a. However, the size of the opening 14c and the size of the opening 14a can be reversed.

Therefore, in the present embodiment, in a state where the substrates 61-63 are layered, the protruding section 19 is formed from an upper surface 65 and an opening end surface 66 of the substrate 62 protruding more inward of the opening 14 than the substrate 63 (more specifically, the opening portion lower edge 63b of the substrate 63) and a lower surface 67 of the substrate 62 protruding more inward of the opening 14 than the substrate 61 (more specifically, the opening portion upper edge 61a of the substrate 61) in a state where the substrates 61-63 are layered.

Further, the opening end surface 16 is formed from the opening end surface 44 of the substrate 43, in the substrate 62, the upper surface 45 protruding more inward of the opening 14 than the substrate 63, the opening end surface 66, and the lower surface 67 protruding more inward of the opening 14 than the substrate 61, and the opening end surface 68 of the substrate 41.

In the present embodiment, θ1 and θ2 are defined similarly to how they are defined in embodiment 3.

Put another way, in the present embodiment, when viewed from a side of the opening portion upper edge 63a (that is, the opening portion upper edge 16a) of the substrate 63, θ1 is defined by an acute angle defined between a plane L12 passing through the opening portion upper edge 62a of the substrate 62, the opening portion upper edge 62a being the corner portion positioned most inward of the opening 14, and the opening portion upper edge 63a of the substrate 63, the opening portion upper edge 63a being the corner portion positioned second most inward of the opening 14, and a plane parallel to the film-formation surface 200a of the substrate 200.

Further, when viewed from a side of the opening portion lower edge 61b of the substrate 61 (that is, the opening portion lower edge 16b), θ2 is defined as an acute angle defined between a plane L13 that passes through the opening portion lower edge 62b of the substrate 62, the opening portion lower edge 62b being the corner portion positioned most inward of the opening 14, and the opening portion lower edge 61b of the substrate 61, the opening portion lower edge 61b being the corner portion positioned second most inward of the opening 14, and a plane parallel to the film-formation surface 200a of the substrate 200.

In this way, even when there is no inclined surface in the opening end surface 16, if θ1 and θ2 are set to be 43° or less, then effects similar to those of embodiment 1 can be obtained.

However, when the tip section 19a of the protruding section 19 is a vertical surface, as illustrated in FIG. 141B, the position of the tip section 19a—that is, the sealing film 130 is deposited on the opening end surface 66 of the substrate 62, the opening end surface 66 being the tip section 19a of the protruding section 19—changes. Therefore, if the film thickness of the sealing film 130 deposited on the opening end surface 66 becomes thick, the 90% film thickness position and the film-forming width of the portion below the protruding section 19 change. Therefore, in this case, if the mask 11 making use of the mask substrate 12 is repeatedly used, the position of the film of the shadow portion shifts by the film thickness of the sealing film 130 deposited on the opening end surface 66. Furthermore, with a decrease of the sealing film 130 deposited on the opening end surface 66, the decreased sealing film 130 may be mixed as a foreign matter in the sealing film 130 formed on the substrate 200.

Therefore, in this case, the mask 11 is cleaned preferably for every film formation.

Summary

The film-forming mask (mask 11) according to embodiment 1 of the present invention is a film-forming mask used to overlap a film-formation substrate (substrate 200), provided with a mask substrate 12 having an opening 14 that exposes a film-formation surface 200a of the film-formation substrate, comprising, in the opening end surface 16 in the opening 14, a protruding section 19 that protrudes more inward of the opening 14 than a first edge portion (opening portion lower edge 16b), which is a contact side edge portion with the film-formation substrate and a second edge portion (opening portion upper edge 16a), which is the other edge portion in the opening end surface 16, wherein, when viewed from a side of the second edge portion, in the opening end surface 16, an acute angle defined between a plane passing through a corner portion positioned most inward of the opening 14 of the corner portions including the second edge portion and a tip section 19a of the protruding section 19 and a corner portion positioned second most inward of the opening 14 and a plane parallel to the film-formation surface 200a is designated as θ1, wherein, when viewed from a side of the first edge portion, in the opening end surface 16, an acute angle defined between a plane passing through a corner portion positioned most inward of the opening 14 of the corner portions including the first edge portion and the tip section 19a of the protruding section 19 and a corner portion positioned second most inward of the opening 14 and a plane parallel to the film-formation surface 200a is designated as θ2, wherein θ1 and θ2 are 43° or less, wherein the height from the film-formation surface 200a to the tip section 19a of the protruding section 19 is equal to or greater than the thickness of a film to be formed on the film-formation surface 200a (for example, the sealing film 130).

According to the examination and consideration on the part of the present inventors, when a mask having a vertical edge surface is used, the average angle defined between a plane passing through the opening portion upper edge of the mask and a 90% film thickness position at which a film having a film thickness of 90% of a set film thickness is obtained and a plane passing through the 90% film thickness position and perpendicular to the substrate surface of the film-formation substrate is 43°. That is, the position where film-forming material flying at 43° with respect to the film-formation surface 200a of the film-formation substrate collides with the mask comprising the vertical edge surface is the opening portion upper edge of the mask.

On the other hand, according to the present embodiment, by making θ1 to 43° or less, the position where the film-forming material flying at 43° with respect to the film-formation surface 200a of the film-formation substrate collides with the mask substrate 12 can be shifted from the opening portion upper edge to the tip section 19a of the protruding section 19.

Accordingly, if θ1 is set to 43° or less, the distance from the mask edge to the 90% film thickness position can be shortened by the distance from the second edge portion to the tip section 19a of the protruding section 19.

In addition, according to the configuration described above, between a position where the plane passing through the tip section 19a of the protruding section 19 and having an inclined angle of 43° with respect to the film-formation surface 200a intersects with the film-formation substrate more inward of the opening 14 than the opening edge of the mask substrate 12 and a position where the plane passing through the tip section 19a of the protruding section 19 and having an inclined angle of 43° with respect to the film-formation surface 200a intersects with the film-formation substrate closer to a side of a mask substrate 12 than the opening edge of the mask substrate 12, a film having 90% film thickness of the set value is formed, and on further closer to the side of the mask substrate 12, the film thickness is 10% or less.

Therefore, according to the configuration described above, in the vicinity of the mask edge, a film having 90% film thickness of the set value can be formed and in the vicinity of the first edge portion, the film to be formed can be made sufficiently thin.

Further, by making the height from the film-formation surface 200a to the tip section 19a of the protruding section 19 to be equal to or greater than the thickness of of the film formed on the film-formation surface 200a, the film formed on the protruding section 19 and the film formed on the film-formation surface 200a are not continuous.

Accordingly, according to the configuration described above, it is possible to provide a film-forming mask capable of preventing film thickness decreases in the mask edge vicinity of the film to be formed and capable of preventing film peeling that occurs when removing the film-forming mask from the film-formation substrate.

With the film-forming mask according to embodiment 2 of the present invention, the mask substrate 12 in embodiment 1 may comprise a layered structure that comprises a plurality of substrates (for example, substrates 21 and 22, substrates 31 and 32, substrates 41-43, substrates 51 and 52, and substrates 61-63).

According to the configuration described above, it is possible to reinforce and suppress the deformation of the mask substrate 12.

The film-forming mask according to embodiment 3 of the present invention is such that the protruding section 19 in embodiment 1 or embodiment 2 may comprise a tapered shape having the first edge portion and the second edge portion as a hem portion.

According to the configuration described above, the entire opening end surface 16 comprises an inclined surface having a tapered shape, and it is possible to provide the film-forming mask capable of defining θ1 and θ2 by using the tip section 19a of the protruding section 19 and the first edge portion and the second edge portion.

According to the configuration described above, as it is possible to set the opening portion lower edge 16b of the mask substrate 12 as an obtuse angle, the base film 201 may not be damaged. In addition, according to the configuration described above, burrs are less likely to occur than in the configuration where the opening end surface comprises a vertical angle, and there is also the benefit that burrs do not easily dig into the base film 201.

In the film-forming mask according to embodiment 4 of the present invention, the opening diameters of adjacent substrates of the plurality of substrates are different from each other in embodiment 2, and the mask substrate 12 can comprise a layered structure layering the plurality of substrates such that the opening centers of each substrate are respectively aligned.

According to the configuration described above, the opening end surface 16 of the mask substrate 12 is provided with a plurality of corner portions, and by using the edge portions of the opening end surface of each substrate forming the corner portions, it is possible to provide the film-forming mask in which θ1 and θ2 are defined.

With the film-forming mask according to embodiment 5 of the present invention, the opening end surface of at least one substrate of the plurality of substrates in embodiment 4 (for example, the opening end surface 24 of the substrate 21, the opening end surface 23 of the substrate 22, the opening end surface 35 of the substrate 31, the opening end surface 46 of the substrate 42, and the opening end surface 53 of the substrate 52) can comprise an inclined surface, while one edge portion of the inclined surface can be the tip section 19a of the protruding section 19.

According to the configuration described above, the film-forming material does not adhere easily to the tip section 19a of the protruding section 19, and even if used repeatedly, a mask 11 having high reliability can be provided.

With the film-forming mask according to embodiment 6 of the present invention, the substrate having the inclined surface in embodiment 5 can be a substrate in contact with the film-formation substrate.

According to the configuration described above, as it is possible to set the opening portion lower edge 16b of the mask substrate 12 as an obtuse angle, the base film 201 may not be damaged. In addition, according to the configuration described above, burrs are less likely to occur than in the configuration where the opening end surface comprises a vertical angle, and there is also the benefit that burrs do not easily dig into the base film 201.

With the film-forming mask (mask 11) according to embodiment 7 of the present invention, in embodiment 4 or embodiment 5, when viewed from a side of the first edge portion, a point (for example, point P2) where a plane that passes through a corner portion positioned most inward of the opening 14 of the corner portions including the first edge portion and the tip section 19a of the protruding section 19 in the opening end surface 16 and a corner portion positioned second most inward of the opening 14 intersects with the film-formation substrate can be positioned more inward of the opening 14 than the first edge portion.

According to the configuration described above, it is possible to provide a film-forming mask that more easily suppresses the continuous formation of a film between the first edge portion and the substrate 200.

A film-forming device (CVD device 1) according to embodiment 8 of the present invention comprises the film-forming mask (mask 11) according to any one of embodiments 1-7.

According to the configuration described above, it is possible to provide a film-forming device that prevents film thickness decreasing in the mask edge vicinity of the film to be formed while also being capable of preventing film peeling occurring when removing the film-forming mask from the film-formation substrate.

The film-forming method according to embodiment 9 of the present invention is a film-forming method that forms a film (for example, the sealing film 130) having a prescribed pattern on the film-formation substrate (substrate 200), comprising superimposing and arranging the film-forming mask (mask 11) according to any one of embodiments 1-7 and the film-formation substrate such that the first edge portion (opening portion lower edge 16b) of the film-forming mask contacts the film-formation surface 200a of the film-formation substrate and depositing the film-forming material on the film-formation surface 200a of the film-formation substrate via the opening 14 in the film-forming mask.

According to the configuration described above, it is possible to provide a film-forming method that prevents film thickness decreasing in the mask edge vicinity of the film to be formed and that is capable of preventing film peeling that occurs when removing the film-forming mask from the film-formation substrate.

With the film-forming method according to embodiment 10 of the present invention, the film-formation substrate in embodiment 9 comprises an organic electroluminescence element (organic EL element 120) and the film formed on the film-formation substrate can be the sealing film 130 that covers the organic electroluminescence element.

In particular, in the organic EL display device, preventing decreasing of the film thickness in the edge portion of the sealing film 130 and film peeling is very important to secure the reliability of the organic EL display device. The film-forming method described above is suitable in forming the sealing film 130.

The present invention is not limited to the above-described embodiments, and in the scope defined in the claims, a variety of alterations are possible, and embodiments obtained by appropriately combining technical means respectively disclosed in different embodiments are within the technical scope of the present invention. Furthermore, it is possible to form new technical features by combining the technical means respectively disclosed in each embodiment.

INDUSTRIAL APPLICABILITY

The present invention can be suitably used for manufacturing an organic EL display device—in particular, for forming a sealing film covering the organic EL element in the organic EL display device.

EXPLANATION OF REFERENCE NUMBERS

1 CVD device (film-forming device)
2 Chamber
2a Gas supply port
2b Exhaust port
3 Gas supply pipe
4 Gas supply source for film formation
5 Exhaust pipe
6 Vacuum pump
7 Susceptor
8 Shower head
8a Gas diffusion chamber
8b Gas spray apertures
9 RF plasma power source
10 Mask elevator mechanism
11 Mask (film-forming mask)
12 Mask substrate
13 Mask frame
14, 14a. 14b Opening
15 Non-opening portion
16 Opening end surface
16a Opening portion upper edge (second edge portion)
16b Opening portion lower edge (first edge portion)
17 Upper inclined surface
18 Lower inclined surface
19 Protruding section
19a Tip section
21, 22, 31, 32, 41-43, 51, 52, 61-63 Substrate
23, 24, 33, 35, 44, 46, 48, 53, 55, 64, 66, 68 Opening edge surface
31a, 32a, 41a, 42a, 43a, 51a, 52a, 61a, 62a, 63a Opening portion upper edge
31b, 32b, 41b, 42b, 43b, 51b, 52b, 61b, 62b, 63b Opening portion lower edge
34, 45, 65 Upper surface
47, 54, 67 Lower surface
100 Organic EL display device
101 Insulation substrate
102 TFT
103 Signal lines
104 Interlayer insulation film
104a Contact hole
105 Edge cover
105a Opening
110 TFT substrate
120 Organic EL element 121 First electrode
122 Organic EL layer
123 Second electrode
130 Sealing film (film)
140 Sub-pixel
200 Substrate
200a Film-formation surface
201 Base film
210 Photoresist
211 Opening portion
S Film-forming region

The invention claimed is:

1. A film-forming mask used to overlap a film-formation substrate, provided with a mask substrate comprising an opening portion that exposes a film-formation surface of the film-formation substrate, comprising, in an opening end surface in the opening portion,
a protruding section that protrudes more inward of the opening portion than a first edge portion, the first edge portion being a contact side edge portion with the film-formation substrate and a second edge portion, the second edge portion being the other edge portion, in the opening end surface,
wherein when viewed from a side of the second edge portion, an acute angle defined between a plane passing through a corner portion positioned most inward of the opening portion of corner portions including the second edge portion and a tip section of the protruding section and a corner portion positioned second most inward of the opening portion and a plane parallel to the film-formation surface is designated as θ1,
wherein when viewed from a side of the first edge portion, an acute angle defined between a plane passing through a corner portion positioned most inward of the opening portion of the corner portions including the first edge portion and the tip section of the protruding section and a corner portion positioned second most inward of the opening portion and a plane parallel to the film-formation surface is designated as θ2, wherein θ1 and θ2 are 43° or less, and
wherein the height from the film-formation surface to the tip section of the protruding section is equal to or greater than the thickness of a film to be formed on the film-forming surface.

2. The film-forming mask according to claim 1,
wherein the mask substrate comprises a layered structure formed from layering a plurality of substrates.

3. The film-forming mask according to claim 1,
wherein the protruding section comprises a tapered shape having the first edge portion and the second edge portion as a hem portion.

4. The film-forming mask according to claim 2,
wherein opening, diameters of adjacent substrates of the plurality of substrates are different from one another, and
wherein the mask substrate comprises a layered structure comprising the plurality of substrates such that opening centers of each substrate are respectively aligned.

5. The film-forming mask according to claim 4,
wherein an opening end surface of at least one substrate of the plurality of substrates comprises an inclined surface, and
wherein one edge portion of the inclined surface is a tip section of the protrusion portion.

6. The film-forming mask according to claim 5, wherein a substrate comprising the inclined surface is a substrate in contact with the film-formation substrate.

7. The film-forming mask according to claim 4,
wherein when viewed from the side of the first edge portion, a point where a plane passing through a corner portion positioned most inward of the opening portion of corner portions including the first edge portion and the tip section of the protruding section in the opening end surface and a corner portion positioned second most inward of the opening portion intersects with the film-formation substrate is positioned more inward of the opening portion than the first edge portion.

8. A film-forming device comprising the film-forming mask defined in claim 1.

9. A film-forming method that forms a film comprising a predetermined pattern on a film-formation substrate, comprising:
superimposing and arranging the film-forming mask defined in claim 1 and the film-formation substrate so the first edge portion of the film-forming mask contacts a film-formation surface of the film-formation substrate; and
depositing a film-forming material on the film-formation surface of the film-formation substrate via the opening portion in the film-forming mask.

10. The film-forming method according to claim 9,
wherein the film-formation substrate comprises an organic electroluminescence element, and
wherein a film formed on the film-formation substrate is a sealing film covering the organic electroluminescence element.

* * * * *